United States Patent
Bang et al.

(10) Patent No.: US 11,605,691 B2
(45) Date of Patent: Mar. 14, 2023

(54) DISPLAY DEVICE

(71) Applicant: Samsung Display Co., Ltd., Yongin-si (KR)

(72) Inventors: Ki Ho Bang, Hwaseong-si (KR); Seong Ryong Lee, Hwaseong-si (KR); Sang Hyun Jun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 17/135,828

(22) Filed: Dec. 28, 2020

(65) Prior Publication Data

US 2021/0118963 A1 Apr. 22, 2021

Related U.S. Application Data

(63) Continuation of application No. 16/360,543, filed on Mar. 21, 2019, now Pat. No. 10,879,319.

(30) Foreign Application Priority Data

Sep. 17, 2018 (KR) .................. 10-2018-0110886

(51) Int. Cl.
*H01L 27/32* (2006.01)
*H01L 51/52* (2006.01)
(Continued)

(52) U.S. Cl.
CPC ........ *H01L 27/3272* (2013.01); *G06F 3/0412* (2013.01); *G06F 3/0443* (2019.05);
(Continued)

(58) Field of Classification Search
CPC .... H01L 27/3272; H01L 27/323; H01L 27/32
See application file for complete search history.

(56) References Cited

U.S. PATENT DOCUMENTS

| 7,129,523 B2 | 10/2006 | Yamazaki et al. |
| 7,190,115 B2 | 3/2007 | Tsuchiya et al. |

(Continued)

FOREIGN PATENT DOCUMENTS

| EP | 2019432 | 1/2009 |
| EP | 3276459 | 1/2018 |
| EP | 3276463 | 1/2018 |

OTHER PUBLICATIONS

Office Action dated May 6, 2022, issued to European Patent Application No. 19195905.5.

(Continued)

*Primary Examiner* — Victoria K. Hall
(74) *Attorney, Agent, or Firm* — H.C. Park & Associates, PLC

(57) ABSTRACT

A display device includes: a base layer including a display area (DA) and a non-DA; a circuit element layer on the base layer and including: a power supply electrode (PSE) overlapping the non-DA, circuit elements, and a shielding electrode connected to the PSE and overlapping some of the circuit elements; a display element layer on the circuit element layer and including: a light emitting element including a first electrode, a light emitting unit, and a second electrode, and a connection electrode connecting the second electrode to the PSE and including first through-holes; a thin film encapsulation layer (TFEL) on the display element layer and including an organic layer overlapping the DA; and an input sensing layer on the TFEL and including sensing electrodes and sensing signal lines connected to the sensing electrodes. The sensing signal lines overlap the connection electrode. Some of the first through-holes overlap the shielding electrode.

17 Claims, 20 Drawing Sheets

(51) Int. Cl.
G06F 3/044 (2006.01)
G06F 3/041 (2006.01)

(52) U.S. Cl.
CPC ........ *G06F 3/0446* (2019.05); *G06F 3/04164* (2019.05); *H01L 27/323* (2013.01); *H01L 27/326* (2013.01); *H01L 27/3276* (2013.01); *H01L 51/52* (2013.01); *H01L 51/5221* (2013.01); *G06F 2203/04111* (2013.01); *H01L 27/3232* (2013.01); *H01L 51/5253* (2013.01)

(56) References Cited

U.S. PATENT DOCUMENTS

| | | | |
|---|---|---|---|
| 7,279,708 B2 | 10/2007 | Kwak | |
| 7,538,488 B2 | 5/2009 | Kwak | |
| 9,000,428 B2 | 4/2015 | Lee et al. | |
| 9,035,546 B2 | 5/2015 | Choi et al. | |
| 9,412,801 B2 | 8/2016 | Choi | |
| 10,083,992 B2 | 9/2018 | Go et al. | |
| 10,269,881 B2 | 4/2019 | Go et al. | |
| 10,312,305 B2 | 6/2019 | Kim et al. | |
| 10,347,706 B2 | 7/2019 | Kim | |
| 10,564,464 B2 | 2/2020 | Wang et al. | |
| 10,642,390 B2 * | 5/2020 | Lee | H01L 51/5253 |
| 10,644,084 B2 * | 5/2020 | Lhee | H01L 27/3279 |
| 10,866,663 B2 * | 12/2020 | Jun | G06F 3/04164 |
| 10,879,319 B2 * | 12/2020 | Bang | G06F 3/0412 |
| 10,978,447 B2 * | 4/2021 | Kim | H01L 51/5228 |
| 11,004,915 B2 * | 5/2021 | Byun | H01L 27/3276 |
| 11,183,543 B2 * | 11/2021 | Bang | H01L 51/5237 |
| 11,211,443 B2 * | 12/2021 | Lee | H01L 29/78678 |
| 11,227,906 B2 * | 1/2022 | Lhee | H01L 51/5253 |
| 11,307,691 B2 * | 4/2022 | Lee | H01L 27/3244 |
| 2005/0016462 A1 | 1/2005 | Yamazaki et al. | |
| 2005/0218396 A1 | 10/2005 | Tsuchiya et al. | |
| 2005/0263775 A1 | 12/2005 | Ikeda et al. | |
| 2006/0060850 A1 | 3/2006 | Kwak et al. | |
| 2009/0026932 A1 | 1/2009 | Kwak et al. | |
| 2012/0080664 A1 | 4/2012 | Kim et al. | |
| 2012/0256973 A1 | 10/2012 | Choi et al. | |
| 2012/0268002 A1 | 10/2012 | Osako et al. | |
| 2013/0069853 A1 | 3/2013 | Choi | |
| 2014/0332769 A1 * | 11/2014 | Lee | H01L 27/3272 257/40 |
| 2015/0034921 A1 | 2/2015 | Kim | |
| 2015/0116295 A1 * | 4/2015 | Pyon | G09G 3/3266 345/80 |
| 2015/0228927 A1 | 8/2015 | Kim | |
| 2015/0357396 A1 * | 12/2015 | Han | H01L 27/3262 257/40 |
| 2015/0372253 A1 | 12/2015 | Hong et al. | |
| 2016/0239143 A1 | 8/2016 | Song | |
| 2016/0268356 A1 | 9/2016 | Go et al. | |
| 2016/0276422 A1 | 9/2016 | Kim | |
| 2016/0300895 A1 * | 10/2016 | Jun | H01L 27/3267 |
| 2017/0330921 A1 | 11/2017 | Lee et al. | |
| 2017/0373270 A1 | 12/2017 | Kim et al. | |
| 2018/0032189 A1 * | 2/2018 | Lee | G06F 3/0445 |
| 2018/0033830 A1 | 2/2018 | Kim et al. | |
| 2018/0083087 A1 | 3/2018 | Choi | |
| 2019/0006442 A1 * | 1/2019 | Byun | H01L 27/3246 |
| 2019/0043938 A1 * | 2/2019 | Lee | G09G 3/3258 |
| 2019/0148469 A1 | 5/2019 | Lhee et al. | |
| 2019/0237533 A1 | 8/2019 | Kim et al. | |
| 2020/0035773 A1 * | 1/2020 | Cheng | H01L 27/3272 |
| 2020/0264722 A1 | 8/2020 | Lee et al. | |
| 2021/0134924 A1 * | 5/2021 | Ha | H01L 27/3246 |

OTHER PUBLICATIONS

Non-Final Office Action dated Apr. 24, 2020, in U.S. Appl. No. 16/360,543.

Notice of Allowance dated Aug. 27, 2020, in U.S. Appl. No. 16/360,543.

Extended European Search Report dated Jan. 24, 2020, in European Patent Application No. 19195905.5.

* cited by examiner

NDA : NDA1, NDA2, NDA3, NDA4

DISPLAY DEVICE

CROSS-REFERENCE TO RELATED APPLICATIONS

This application is a Continuation of U.S. patent application Ser. No. 16/360,543, filed Mar. 21, 2019, which issued as U.S. Pat. No. 10,879,319, and claims priority to and the benefit of Korean Patent Application No. 10-2018-0110886, filed Sep. 17, 2018, each of which is hereby incorporated by reference for all purposes as if fully set forth herein.

BACKGROUND

Field

Exemplary embodiments generally relate to a display device, and, more particularly, to a display device including an input sensing unit.

Discussion

A display device displays an image, and can be used for multimedia appliances, such as televisions, portable phones, tablet computers, navigators, game machines, etc. The display device may include a keyboard or a mouse as input means. Some display devices may include a sensing panel as input means.

The above information disclosed in this section is only for understanding the background of the inventive concepts, and, therefore, may contain information that does not form prior art.

SUMMARY

Some exemplary embodiments provide an input sensing unit-integrated display device capable of reducing noise for an input sensing unit.

Additional aspects will be set forth in the detailed description which follows, and, in part, will be apparent from the disclosure, or may be learned by practice of the inventive concepts.

According to some exemplary embodiments, a display device includes a base layer, a circuit element layer, a display element layer, a thin film encapsulation layer, and an input sensing layer. The base layer includes a display area and a non-display area. The circuit element layer is disposed on the base layer. The circuit element layer includes: a power supply electrode overlapping the non-display area; circuit elements on the base layer; and a shielding electrode connected to the power supply electrode and overlapping at least some of the circuit elements. The display element layer is disposed on the circuit element layer. The display element layer includes: a light emitting element including a first electrode, a light emitting unit, and a second electrode; and a connection electrode connecting the second electrode to the power supply electrode. The connection electrode includes first through-holes. The thin film encapsulation layer is disposed on the display element layer. The thin film encapsulation layer includes an organic layer overlapping the display area. The input sensing layer is disposed on the thin film encapsulation layer. The input sensing layer includes sensing electrodes and sensing signal lines connected to the sensing electrodes. The sensing signal lines overlap the connection electrode. At least some of the first through-holes of the connection electrode overlap the shielding electrode.

According to some exemplary embodiments, a display device includes pixels, a power supply line, a driving circuit, a connection electrode, and a shielding electrode. The pixels are disposed in a display area of the display device. Each pixel among the pixels includes a light emitting element. The power supply line is disposed in a non-display area of the display device, the non-display area surrounding the display area. The driving circuit is disposed between the power supply line and the display area. The driving circuit is configured to provide a signal to the pixels. The connection electrode electrically connects the power supply line to each of the light emitting elements of the pixels. The shielding electrode is connected to the power supply line. The shielding electrode is disposed between the driving circuit and the connection electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF THE ILLUSTRATED EMBODIMENTS

Figure 1:
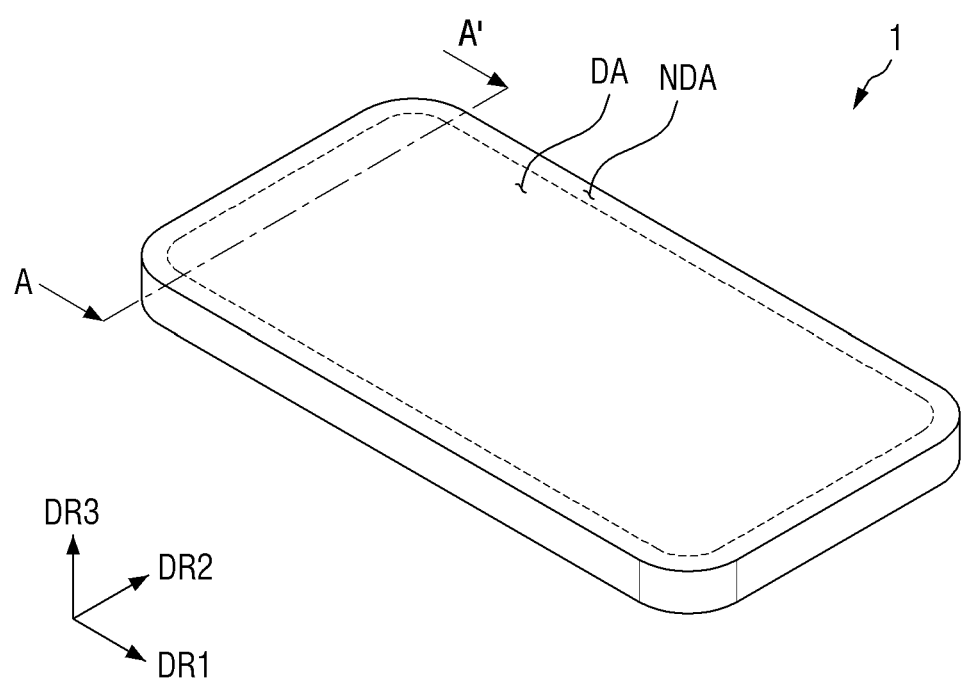
FIG. 1 is a perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter, individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

FIG. 1 is a perspective view of a display device according to some exemplary embodiments.

Referring to FIG. 1, a display device 1 may display an image through a display surface (or a front surface). The display surface may be parallel to a plane defined by a first directional axis (that is, an axis extending in a first direction DR1) and a second directional axis (that is, an axis extending in a second direction DR2). The normal direction of the display surface, that is, the thickness direction of the display device 1, may be defined as a third direction DR3. The front surface (or upper surface) and the back surface (or lower surface) of each of the members or units described below may be divided along the third direction DR3. However, the first to third directions DR1, DR2 and DR3 shown in FIG. 1 are merely examples, and may be converted into different directions.

The display device 1 may have a flat display surface, but exemplary embodiments are not limited thereto. For example, the display device 1 may have a curved display surface, a stereoscopic display surface, etc. The stereoscopic display surface may include a plurality of display areas indicating different directions, and may include, for example, a polygonal columnar display surface.

The display device 1 may be a rigid display device. However, exemplary embodiments are not limited thereto. For example, the display device 1 may be a flexible display device. FIG. 1 exemplarily shows a display device capable of being applied to a mobile phone terminal. Although not shown in FIG. 1, electronic modules, a camera module, a power module, and the like, which are mounted on a main board, are provided in a bracket, a case, or the like together with the display device 1, thereby constituting a mobile phone terminal. The display device 1 may be applied to not only large electronic appliances, such as televisions and monitors, but also small and medium electronic appliances, such as tablets, car navigators, game machines, smart watches, etc.

The display surface includes a display area DA where an image is displayed, and a non-display area NDA adjacent to the display area DA. The non-display area NDA is an area where no image is displayed. The display area DA may have a rectangular shape including rounded corners. The non-display area NDA may surround the display area DA. However, exemplary embodiments are not limited thereto, and the shape of the display area DA and the shape of the non-display area NDA may be relatively designed.

Figure 2:
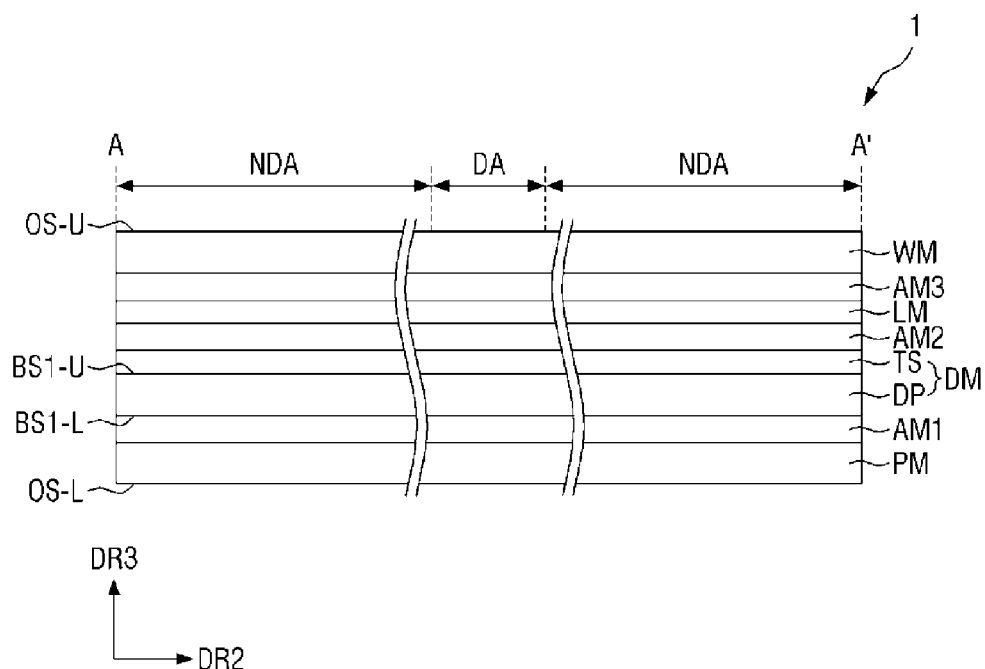
FIG. 2 is a cross-sectional view of a display device taken along sectional line A-A' of FIG. 1 according to some exemplary embodiments.

FIG. 2 is a cross-sectional view of a display device taken along sectional line A-A' of FIG. 1 according to some exemplary embodiments.

Referring to FIG. 2, a display device 1 includes a protective film PM, a display module DM, an optical member LM, a window WM, a first adhesive member AM1, a second adhesive member AM2, and a third adhesive member AM3.

The window WM may be disposed over the display module DM, and the optical member LM may be disposed between the display module DM and the window WM. The protective film PM may be disposed under the display module DM. The first adhesive member AM1 attaches the display module DM to the protective film PM, the second adhesive member AM2 attaches the display module DM to the optical member LM, and the third adhesive member AM3 attaches the optical member LM to the window WM.

The protective film PM protects the display module DM. The protective film PM provides a first outer surface OS-L exposed to the outside, and provides an adhesive surface to be bonded to the first adhesive member AM1. The adhesive surface opposes the first outer surface OS-L. The protective film PM prevents external moisture from penetrating the display module DM, and absorbs external impact.

The protective film PM may include a plastic film as a base layer. The protective film PM may include a plastic film as a base substrate. The plastic film may include any one selected from polyethersulfone (PES), polyacrylate, polyetherimide (PEI), polyethylene naphthalate (PEN), polyethylene terephthalate (PET) polyphenylene sulfide (PPS), polyarylate, polyimide (PI), polycarbonate (PC), poly (arylene ether sulfone), and any combination of at least two of the aforementioned materials. The material constituting the protective film PM is not limited to plastic resins, and may include an organic/inorganic composite material.

The protective film PM may include a porous organic layer and an inorganic material filling the pores of the porous organic layer. The protective film PM may further include a functional layer formed on the plastic film. The functional layer may include a resin layer. The functional layer may be formed by coating. The protective film PM may be omitted.

The window WM may protect the display module DM from an external impact, and may provide an input surface OS-U to a user. The window WM may include a plastic film as a base member. The window WM may have a multi-layer structure. The base member of the window WM may have a multi-layer structure selected from a glass substrate, a plastic film, and a plastic substrate. The window WM may further include a bezel pattern. The multi-layer structure may be formed through a continuous process or an adhesion process using an adhesive layer. The window WM may further include a functional layer disposed on the base member. The functional layer may include a hard coating layer, a fingerprint prevention layer, an antireflection layer, a self-healing layer, and/or the like.

The optical member LM reduces external light reflectance. The optical member LM may include a polarizing film. The optical member LM may further include a retardation film. The optical member LM may be omitted.

The display module DM may include a display unit DP and an input sensing unit TS. The display unit DP may be an organic light emitting display panel, but is not particularly limited. For example, the display unit DP may be a quantum dot light emitting display panel, which is another type of self-luminous display panel. The quantum dot light emitting display panel may include a light emitting layer including quantum dots and quantum rods. Hereinafter, the display unit PD will be described, assuming that it is an organic light emitting display panel.

The display unit DP generates an image corresponding to input image data. The display unit DP provides a first display panel surface BS1-L and a second display panel surface BS1-U, which face each other in the thickness direction DR3.

The input sensing unit TS is disposed directly on the display unit DP. As used herein, the phrase "directly disposed on" refers to being formed by a continuous process without being attached using a separate adhesive layer.

The input sensing unit TS acquires coordinate information of an external input. Here, the external input may be a sensing event generated by a user, a sensing pen, or the like. The input sensing unit TS may sense an external input, for example, in a capacitive manner. The operation method of the input sensing unit TS is not particularly limited. For example, the input sensing unit TS may sense an external input by electromagnetic induction, pressure sensing, and/or the like.

Although not shown in FIG. 2, the display module DM may further include an antireflection layer. The antireflection layer may include a color filter or a laminate structure of a conductive layer/an insulating layer/a conductive layer. The antireflection layer may reduce external light reflectance by absorbing, destructively interfering, or polarizing light incident from the outside. The antireflection layer may replace the function of the optical member LM.

Each of the first adhesive member AM1, the second adhesive member AM2, and the third adhesive member AM3 may be an organic adhesive layer, such an optically clear adhesive film (OCA), an optically clear resin (OCR), or a pressure-sensitive adhesive film (PSA). The organic adhesive layer may include an adhesive material, such as polyurethane, polyacrylate, polyester, poly-epoxy, or polyvinyl acetate.

Hereinafter, the display module DM, that is, the display unit DP and the input sensing unit TS, will be described in detail with reference to FIGS. 3 to 13.

Figure 3:
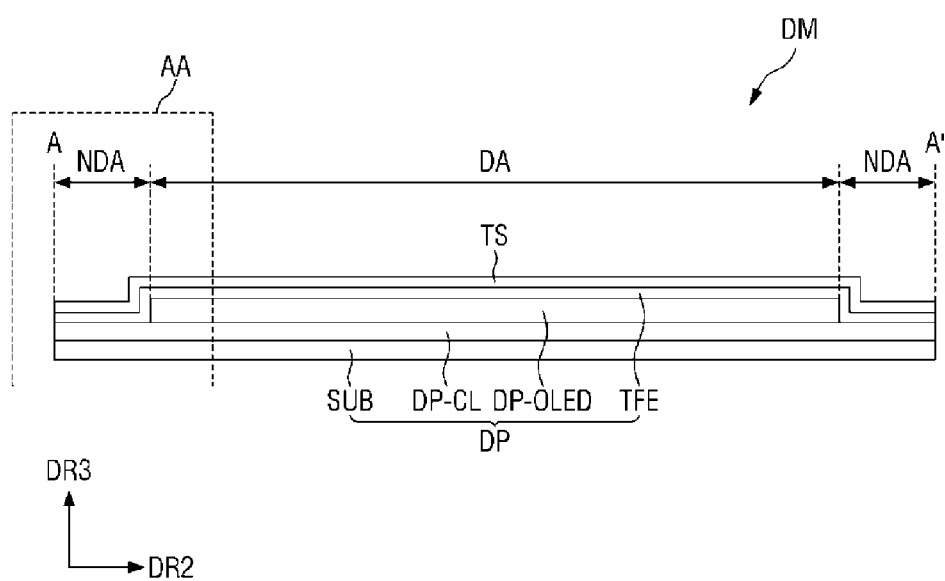
FIG. 3 is a cross-sectional view of a display module included in the display device of FIG. 2 according to some exemplary embodiments.
Figure 4:
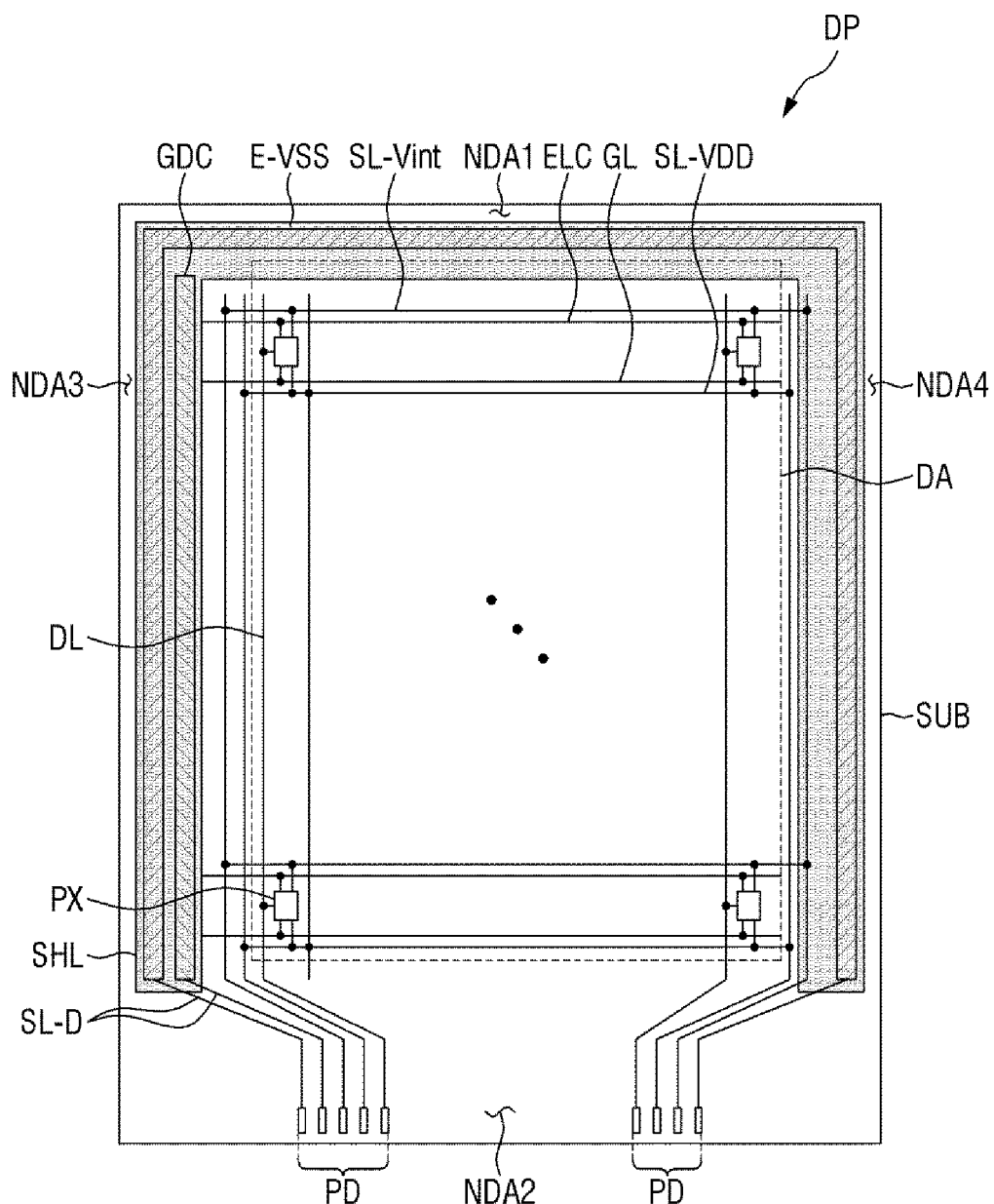
FIG. 4 is a plan view of a display unit included in the display module of FIG. 3 according to some exemplary embodiments.

FIG. 3 is a cross-sectional view of a display module included in the display device of FIG. 2 according to some exemplary embodiments. FIG. 4 is a plan view of a display unit included in the display module of FIG. 3 according to some exemplary embodiments.

First, referring to FIG. 3, the display unit DP includes a base layer SUB, a circuit layer DP-CL on the base layer SUB, a display element layer DP-OLED on a circuit layer DP-CL, and a thin film encapsulation layer TFE on the display element layer DP-OLED.

The base layer SUB may include at least one plastic film. The base layer SUB may include a plastic substrate, a glass substrate, a metal substrate, or an organic/inorganic composite material substrate as a flexible substrate.

The circuit layer DP-CL may include a semiconductor layer, an insulating layer (or intermediate insulating layer), and a conductive layer. The conductive layers of the circuit layer DP-CL may constitute signal lines or a driving circuit of a pixel to be described later.

The display element layer DP-OLED includes a light emitting element (for example, an organic light emitting diode).

The thin film encapsulation layer TFE seals, e.g., hermetically seals, the display element layer DP-OLED. The thin film encapsulation layer TFE includes an inorganic layer and an organic layer. The thin film encapsulation layer TFE may include at least two inorganic layers and an organic layer disposed therebetween. The inorganic layers protect the display element layer DP-OLED from water/oxygen, and the organic layer protects the display element layer DP-OLED from foreign substances, such as dust particles. The inorganic layer may include a silicon nitride layer, a silicon oxynitride layer, a silicon oxide layer, a titanium oxide layer, or an aluminum oxide layer. The organic layer may include, but is not limited to, an acrylic organic layer.

The input sensing unit TS is disposed directly on the thin film encapsulation layer TFE. The input sensing unit TS includes sensing electrodes and sensing signal lines. The sensing electrodes and the sensing signal lines may have a single-layer structure or a multi-layer structure.

The sensing electrodes and the sensing signal lines may include indium tin oxide (ITO), indium zinc oxide (IZO), zinc oxide (ZnO), indium tin zinc oxide (ITZO), poly(3,4-ethylenedioxythiophene) (PEDOT), metal nanowires, or graphene. The sensing electrodes and the sensing signal lines may include a metal layer, such as molybdenum, silver, titanium, copper, aluminum, or an alloy including at least one of the aforementioned materials. The sensing electrodes and the sensing signal lines may have the same layer structure or different layer structures. Details of the input sensing unit TS will be described later with reference to FIGS. 7 to 11. Meanwhile, the area AA shown in FIG. 3 will be described later with reference to FIG. 12.

Referring to FIG. 4, the display unit DP includes a display area DA and a non-display area NDA on a plane.

As described with reference to FIG. 1, the non-display area NDA may be defined along the edge of the display area DA. The display area DA and non-display area NDA of the display unit DP correspond to the display area DA and non-display area NDA of the display device 1, respectively. The display area DA and non-display area NDA of the display unit DP are not necessarily the same as the display area DA and non-display area NDA of the display device 1, and may be changed depending on the structure/design of the display unit DP.

The display unit DP includes a driving circuit, a plurality of signal lines SL-Vint, SL-VDD, ELC, GL, DL and SL-D, a power supply electrode E-VSS, and a plurality of pixel PXs. The area where the pixels PX are arranged may be defined as the display area DA.

The driving circuit may include a scan driving circuit GDC. The scan driving circuit GDC generates a plurality of scan signals, and outputs (e.g., sequentially outputs) the plurality of scan signals to a plurality of scan lines GL to be described later. Further, the scan driving circuit GDC generates a plurality of light emission control signals, and outputs the plurality of light emission control signals to a plurality of light emission control lines ELC.

Although it is shown in FIG. 4 that the scan signals and the light emission control signals are output from one scan driving circuit GDC, exemplary embodiments are not limited thereto. For example, a plurality of scan driving circuits may divide and output the scan signals, and may divide and output the light emission control signals. Further, the driving circuits for generating and outputting the scanning signals and the driving circuits for generating and outputting the light emission control signals may be separately classified. For example, another scan driving circuit different from the scan driving circuit GDC facing the scan driving circuit GDC shown in FIG. 4 in the second direction DR2 may be further disposed.

The scan driving circuit GDC may be included in the circuit layer DP-CL. The scan driving circuit GDC may include a plurality of thin film transistors formed through a same process as the driving circuit of the pixel PX.

Although not shown in FIG. 4, the display unit DP may further include a data driving circuit connected to pads PD in the form of a chip on film (COF). The data driving circuit may be integrated in the circuit layer DP-CL.

The signal lines GL, DL, ELC, SL-VDD, SL-Vint, and SL-D may include scan lines GL, light emission control lines ELC, data lines DL, a power supply line SL-VDD, an initialization voltage line SL-Vint, and a dummy signal line SL-D. The signal lines GL, DL, ELC, SL-VDD, SL-Vint, and SL-D are included in the circuit layer DP-CL, and some of the signal lines may be omitted. The pads PD may be connected to the ends of the signal lines GL, DL, ELC, SL-VDD, SL-Vint, and SL-D.

The scan lines GL are connected to the corresponding pixels PX of the pixels PX, respectively, and the data lines DL are connected to the corresponding pixels PX of the pixels PX, respectively. The light emission control lines ELC may be arranged in parallel to the corresponding scan lines of the scan lines GL, respectively.

The power supply line SL-VDD is connected to the pixels PX, and may provide a first power supply voltage to the pixels PX. The power supply line SL-VDD may include a plurality of lines extending in the first direction DR1 and a plurality of lines extending in the second direction DR2.

The initialization voltage line SL-Vint may provide an initialization voltage to the pixels PX. The initialization voltage line SL-Vint may include a plurality of lines extending in the first direction DR1 and a plurality of lines extending in the second direction DR2.

The dummy signal line SL-D may provide control signals to the scan driving circuit GDC. The dummy signal line SL-D may provide a second power supply voltage to the power supply electrode E-VSS. The second power supply voltage has a different level from the first power supply voltage. The second power supply voltage may have a lower level than the first power supply voltage.

The power supply electrode E-VSS is disposed in the non-display area NDA, and has a shape extending along an edge(s) of the base layer SUB. As shown in FIG. 4, the power supply electrode E-VSS may have a shape facing three edges. The power supply electrode E-VSS may also be included in the circuit layer DP-CL.

As shown in FIG. 4, the power supply electrode E-VSS is disposed outside the scan driving circuit GDC. The power supply electrode E-VSS may extend along the edge of the base layer SUB. The non-display area NDA may include a first non-display area NDA1 and a second non-display area NDA2 facing each other in the first direction DR1 with the display area DA therebetween. The non-display area NDA may include a third non-display area NDA3 and a fourth non-display area NDA4 facing each other in the second direction DR2 with the display area DA therebetween. The power supply electrode E-VSS may be disposed in at least one non-display area of the first non-display area NDA1, the third non-display area NDA3, and the fourth non-display area NDA4. As shown in FIG. 4, the power supply electrode E-VSS may be disposed in the first non-display area NDA1, the third non-display area NDA3, and the fourth non-display area NDA4.

In some exemplary embodiments, the display unit DP may further include a shielding electrode SHL (a shielding layer or a blocking layer).

As shown in FIG. 4, the shielding electrode SHL may be disposed in the non-display area NDA, but the shielding electrode SHL may overlap the power supply electrode E-VSS and the scan driving circuit GDC. As will be described later with reference to FIG. 13, the shielding electrode SHL may be directly connected to the power supply electrode E-VSS, and may cover at least a part of the scan driving circuit GDC. The shielding electrode SHL may be electrically insulated from the scan driving circuit GDC. The shielding electrode SHL may cover the scan driving circuit GDC, thereby blocking noise generated by the scan driving circuit GDC and propagated to the input sensing unit TS to be described later. Therefore, the noise of the input sensing unit TS by the scan driving circuit GDC may be alleviated or prevented. The detailed configuration and function of the shielding electrode SHL will be described later with reference to FIGS. 12 and 13.

Figure 5:
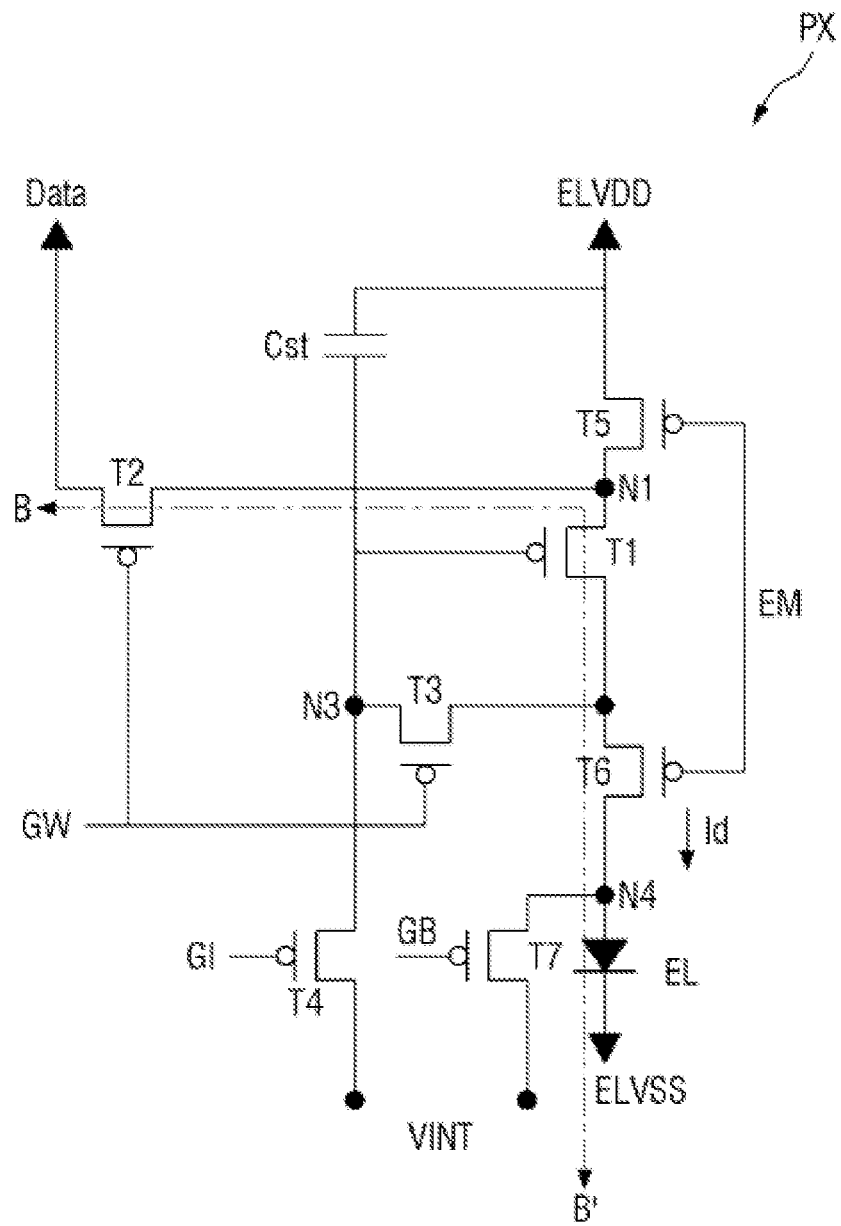
FIG. 5 is a circuit diagram of a pixel included in the display unit of FIG. 4 according to some exemplary embodiments.

FIG. 5 is a circuit diagram of a pixel included in the display unit of FIG. 4 according to some exemplary embodiments.

Referring to FIG. 5, the pixel PX may include a light emitting element EL, first to seventh transistors T1 to T7, and a capacitor Cst (or a storage capacitor).

A data signal DATA, a first scan signal GW, a second scan signal GI, a third scan signal GB, and a light emission control signal EM may be provided to the pixel PX. Here, the second scan signal GI may be the same as the first scan signal GW of the previous point or the previous row. For example, the second scan signal GI[n] provided to the pixel PX of the n-th row may be the same as the first scan signal GW[n−1] provided to the pixel PX of the n−1-th row. Similarly, the third scan signal GB may be the same as the second scan signal GI of the next point or the next row. For example, the third scan signal GB[n] provided to the pixel PX of the n-th row may be the same as the second scan signal GI[n+1] provided to the pixel PX of the n+1-th row.

Each of the first to seventh transistors T1 to T7 may include a first electrode, a second electrode, and a gate electrode. One of the first electrode and the second electrode may be a source electrode, and the other of the first electrode and the second electrode may be a drain electrode.

Each of the first to seventh transistors T1 to T7 may be a thin film transistor. Each of the first to seventh transistors T1 to T7 may be a p-channel metal-oxide-semiconductor field-effect transistor (PMOS) transistor or an n-channel metal-oxide-semiconductor field-effect transistor (NMOS) transistor. Hereinafter, the first to seventh transistors T1 to T7 will be described, assuming that they are PMOS transistors.

The light emitting element EL may include an anode electrode and a cathode electrode. The anode electrode of the light emitting element EL may be connected to a fourth node N4, and the cathode electrode thereof may be connected to a second power supply line (that is, a wiring for transmitting a second power supply voltage ELVSS).

The first transistor T1 (or driving transistor) may include a first electrode connected (or electrically connected) to a first node N1, a second electrode connected to a second node N2, and a gate electrode connected to a third node N3. The first transistor T1 may provide a driving current Id to the light emitting element EL based on a voltage of the third node N3 (or a data voltage stored in the capacitor Cst to be described later).

The second transistor T2 (or switching transistor) may include a first electrode connected to a data line (or receiving the data signal DATA), a second electrode connected to the first node N1, and a gate electrode connected to a first scan line or receiving a first scan signal GW. The second transistor T2 may be turned on in response to the first scan signal GW, and may transmit the data signal DATA to the first node N1.

The third transistor T3 may include a first electrode connected to the second node N2, a second electrode connected to the third node N3, and a gate electrode connected to the first scan line or receiving the first scan signal GW. The third transistor T3 may be turned on in response to the first scan signal GW, and may transmit the data signal DATA to the third node N3.

The capacitor Cst may be connected between the third node N3 and the first power supply voltage ELVDD. The capacitor Cst may store or maintain the provided data signal DATA.

The fourth transistor T4 may include a first electrode connected to the third node N3, a second electrode connected to the initialization voltage line SL-Vint or receiving the initialization voltage VINT, and a gate electrode connected to a second scan line or receiving the second scan signal GI.

The fourth transistor T4 may be turned on in response to the second scan signal GI before the data signal DATA is stored in the capacitor Cst (or after the light emitting element EL emits light), and may initialize the third node N3 (or the capacitor Cst) using the initialization voltage VINT.

In some exemplary embodiments, the third and fourth transistors T3 and T4 may be implemented as a dual transistor (that is, a transistor in the form of a combination of two transistors). In this case, leakage current of the third and fourth transistors T3 and T4 and deterioration of display quality due to the leakage current may be prevented or alleviated.

The fifth transistor T5 and the sixth transistor T6 (or first and second light emission control transistors) may be connected between the first power supply line and the light emitting element EL, and may form a current path through which the driving current Id generated by the first transistor T1 moves.

The fifth transistor T5 may include a first electrode connected to the first power supply line to receive the first power supply voltage ELVDD, a second electrode connected to the first node N1, and a gate electrode connected to a light emission control line ELC or receiving the light emission control signal EM.

The sixth transistor T6 may include a first electrode connected to the second node N2, a second electrode connected to the fourth node N4 (or the anode electrode of the light emitting element EL), and a gate electrode connected to a light emission control line ELC or receiving the emission control signal EM.

The fifth and sixth transistors T5 and T6 are turned on in response to the light emission control signal EM. In this case, a driving current Id is provided to the light emitting element EL, and the light emitting element EL may emit light with the luminance corresponding to the driving current Id.

The seventh transistor T7 may include a first electrode connected to the fourth node N4, a second electrode connected to the initialization voltage line SL-Vint (or the initialization voltage VINT), and a gate electrode connected to a second scan signal line or receiving the third scan signal GB.

The seventh transistor T7 may be turned on in response to the third scan signal GB before the light emitting element EL emits light (or after the light emitting element EL emits light), and may initialize the anode electrode of the light emitting element EL using the initialization voltage VINT. The light emitting element EL may include a parasitic capacitor, and the parasitic capacitor may be charged or discharged by the driving current Id while the light emitting element EL emits light so that the anode electrode of the light emitting element EL may have a non-constant voltage. Therefore, the parasitic capacitor and auxiliary capacitor of the light emitting element EL may be initialized through the seventh transistor T7.

Although it is shown in FIG. 5 that the seventh transistor T7 receives the third scan signal GB, exemplary embodiments are not limited thereto. For example, the seventh transistor T7 may receive the second scan signal GI.

Figure 6:
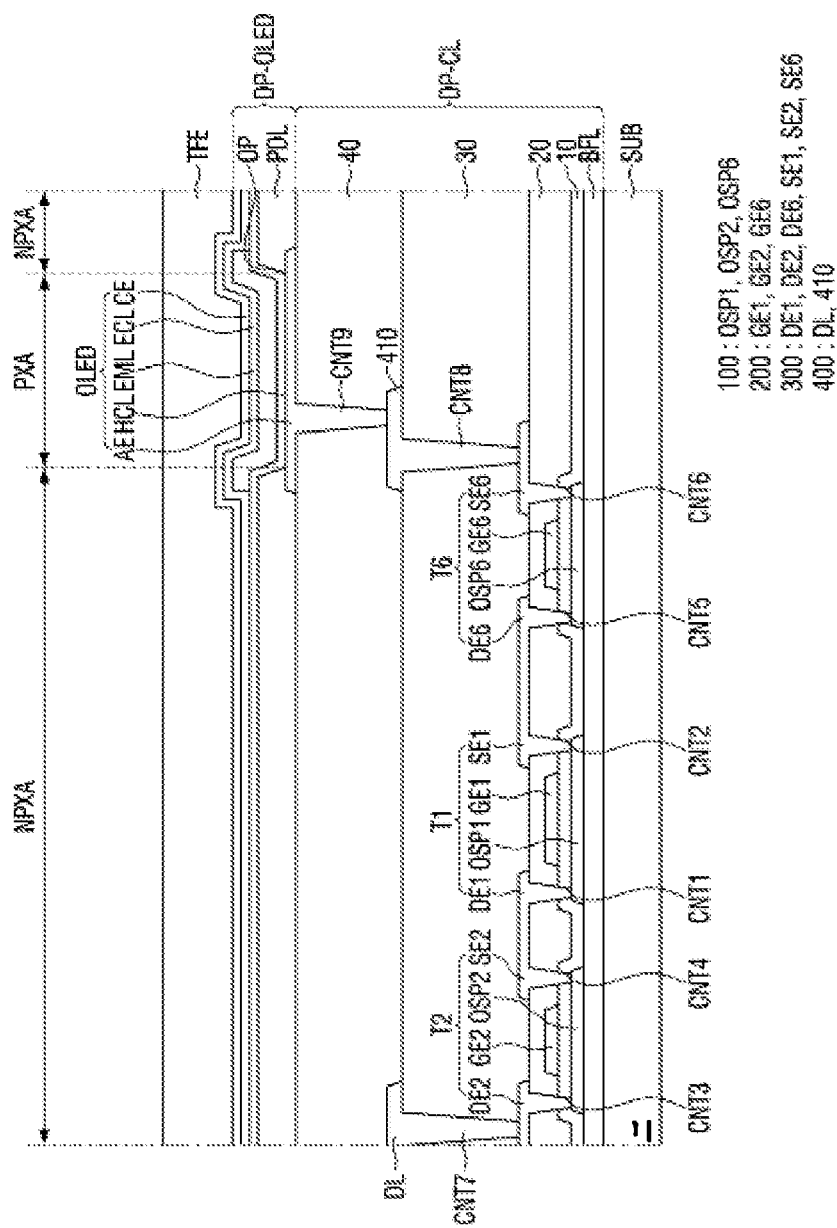
FIG. 6 is a cross-sectional view of a pixel taken along sectional line B-B' of FIG. 5 according to some exemplary embodiments.

FIG. 6 is a cross-sectional view of a pixel taken along sectional line B-B' of FIG. 5 according to some exemplary embodiments. FIG. 6 shows a cross-section corresponding to the second transistor T2, the first transistor T1, the sixth transistor T6, and the light emitting element EL included in the pixel PX of FIG. 5.

Referring to FIG. 6, the pixel PX may include a base layer SUB, a circuit element layer DP-CL, a display element layer DP-OLED, and a thin film encapsulation layer TFE. Since the base layer SUB is substantially the same as the base layer SUB having been described with reference to FIG. 4, a redundant description will not be repeated.

First, the circuit element layer DP-CL will be described.

The circuit element layer DP-CL may include a buffer layer BFL, a semiconductor layer 100, a first insulating layer 10, a first conductive layer 200, a second insulating layer 20, a second conductive layer 300, a third insulating layer 30, a third conductive layer 400, and a fourth insulating layer 40.

The buffer layer BFL may be disposed on the base layer SUB. The buffer layer BFL improves the bonding force between the base layer SUB and conductive patterns or between the base layer SUB and semiconductor patterns. The buffer layer BFL may include an inorganic layer. Although not shown in FIG. 6, a barrier layer for preventing the inflow of foreign matter may be further disposed on the base layer SUB. The buffer layer BFL and the barrier layer may be selectively disposed or omitted.

The semiconductor layer 100 may be disposed on the buffer layer BFL. The semiconductor layer 100 may include a semiconductor pattern OSP2 (hereinafter, referred to as a second semiconductor pattern) of the second transistor T2, a semiconductor pattern OSP1 (hereinafter, referred to as a first semiconductor pattern) of the first transistor T1, and a semiconductor pattern OSP6 (hereafter referred to as a sixth semiconductor pattern) of the sixth transistor T6. The first semiconductor pattern OSP1, the second semiconductor pattern OSP2, and the sixth semiconductor pattern OSP6 may be selected from the group consisting of an amorphous silicon pattern, a polysilicon pattern, and a metal oxide semiconductor pattern; however, exemplary embodiments are not limited thereto.

The first insulating layer 10 may be disposed on the semiconductor layer 100. Although it is shown in FIG. 6 that the first insulating layer 10 is provided in the form of a layer covering the first semiconductor pattern OSP1, the second semiconductor pattern OSP2, and the sixth semiconductor pattern OSP6, this is merely illustrative, and exemplary embodiments are not limited thereto. For example, the first insulating layer 10 may be provided in a pattern disposed corresponding to the first semiconductor pattern OSP1, the second semiconductor pattern OSP2, and the sixth semiconductor pattern OSP6.

The first insulating layer 10 may include a plurality of inorganic layers. The inorganic layers may include at least one of silicon nitride layer, a silicon oxynitride layer, and a silicon oxide layer.

The first conductive layer 200 is disposed on the first insulating layer 10. The first conductive layer 200 may include a gate electrode GE1 (hereinafter, referred to as a first gate electrode) of the first transistor T1, a gate electrode GE2 (hereinafter, referred to as a second gate electrode) of the second transistor T2, and a gate electrode GE6 (hereinafter, referred to as a sixth gate electrode) of the transistor T6. The first gate electrode GE1, the second gate electrode GE2, and the sixth gate electrode GE6 may be manufactured through the same photolithography process as the scan lines GL (refer to FIG. 4).

The second conductive layer 300 is disposed on the second insulating layer 20. The second conductive layer 300 may include an input electrode SE1 (hereinafter, referred to as a first input electrode) and an output electrode DE1 (hereinafter, referred to as a first output electrode) of the first transistor T1, an input electrode SE2 (hereinafter, referred to as a second input electrode) and an output electrode DE2 (hereinafter, referred to as a second output electrode) of the second transistor T2, and an input electrode SE6 (hereinafter, referred to as a sixth input electrode) and an output electrode DE6 (hereinafter, referred to as a sixth output electrode) of the sixth transistor T6.

The first output electrode DE1 is connected to the first semiconductor pattern OSP1 through a first contact hole CNT1 penetrating the first insulating layer 10 and the second insulating layer 20. Similarly, the first input electrode SE1 is connected to the first semiconductor pattern OSP1 through a second contact hole CNT2 penetrating the first insulating layer 10 and the second insulating layer 20. The second output electrode DE2 and the second input electrode SE2 are electrically connected to the second semiconductor pattern OSP2 through a third contact hole CNT3 and a fourth contact hole CNT4 penetrating the first insulating layer 10 and the second insulating layer 20, respectively. The second input electrode SE2 may be electrically connected to the first output electrode DE1 or may be integrated with the first output electrode DE1. The sixth input electrode SE6 and the sixth output electrode DE6 are electrically connected to the sixth semiconductor pattern OSP6 through a fifth contact hole CNT5 and a sixth contact hole CNT6 penetrating the first insulating layer 10 and the second insulating layer 20, respectively. The sixth input electrode SE6 may be electrically connected to the first input electrode SE1 or may be integrated with the first input electrode SE1. Although it is shown in the drawing that the first transistor T1, the second transistor T2, and the sixth transistor T6 have a top gate structure, exemplary embodiments are not limited thereto. For example, at least one of the first transistor T1, the second transistor T2, and the sixth transistor T6 may be modified into a bottom gate structure or a dual gate structure.

The third insulating layer 30 is disposed on the second conductive layer 300 (and the second insulating layer 20). The third insulating layer 30 may cover the first input electrode SE1, the second input electrode SE2, the sixth input electrode SE6, the first output electrode DE1, the second output electrode DE2, and the sixth output electrode DE6. The third insulating layer 30 includes an organic layer and/or an inorganic layer. The third insulating layer 30 may include an organic material to provide a flat surface.

The third conductive layer 400 may be disposed on the third insulating layer 30. The third conductive layer 400 may include a data line DL and a data pattern 410. The data line DL is connected to the second output electrode DE2 of the second transistor T2 through a seventh contact hole CNT7 penetrating the third insulating layer 30. The data pattern 410 is connected to the sixth output electrode DE6 of the sixth transistor T6 through an eighth contact hole CNT8 penetrating the third insulating layer 30.

Although it is not shown in FIG. 6, the third conductive layer 400 may further include a shielding electrode SHL. The shielding electrode SHL is disposed in the non-display area NDA. The detailed structure of the shielding electrode SHL will be described later with reference to FIG. 12 together with the laminate structure of the non-display area NDA.

The fourth insulating layer 40 may be disposed on the third conductive layer 400 (and the third insulating layer 30). The fourth insulating layer 40 may cover the data line DL and the data pattern 410. The fourth insulating layer 40 includes an organic layer and/or an inorganic layer. The fourth insulating layer 40 may include an organic material to provide a flat surface.

The first insulating layer 10, the second insulating layer 20, the third insulating layer 30, and the fourth insulating layer 40 may be defined as intermediate insulating layers. At least one of the first insulating layer 10, the second insulating layer 20, the third insulating layer 30, and the fourth insulating layer 40 may be omitted depending on the circuit structure of the pixel PX, or at least one other insulating layer may be added.

Hereinafter, the display element layer DP-OLED will be described.

A pixel defining layer PDL and an organic light emitting diode OLED are disposed on the fourth insulating layer 40. A first electrode AE is disposed on the fourth insulating layer 40. The first electrode AE is connected to the data pattern 410 through a ninth contact hole CNT9 penetrating the fourth insulating layer 40. Since the data pattern 410 is connected to the sixth output electrode DE6, the first electrode AE may be electrically connected to the sixth output electrode DE6 (that is, the sixth transistor T6) through the data pattern 410.

An opening OP is defined in the pixel defining layer PDL. The opening OP of the pixel defining layer PDL exposes at least a part of the first electrode AE.

The pixel PX may be disposed in a pixel area on the plane. The pixel area may include a light emitting area PXA and a non-light emitting area NPXA adjacent to the light emitting area PXA. The non-light emitting area NPXA may surround the light emitting area PXA. The light emitting area PXA is defined corresponding to a part of the first electrode AE exposed by the opening OP.

A hole control layer HCL may be commonly disposed in the light emitting area PXA and the non-light emitting area NPXA. Although it is not shown in FIG. 6, a common layer, such as the hole control layer HCL, may be formed in common to the plurality of pixels PX (refer to FIG. 4).

A light emitting layer EML is disposed on the hole control layer HCL. The light emitting layer EML may be disposed in an area corresponding to the opening OP. That is, the light emitting layer EML may be separately formed in each of the pixels PX. The light emitting layer EML may include an organic material and/or an inorganic material. Although FIG. 6 illustrates the patterned light emitting layer EML, the light emitting layer EML may be disposed in common to the pixels PX. At this time, the light emitting layer EML may generate white light; however, exemplary embodiments are not limited thereto. The light emitting layer EML may have a multi-layer structure.

An electron control layer ECL is disposed on the light emitting layer EML. The electron control layer ECL may be formed in common to the pixels PX (refer to FIG. 5A).

A second electrode CE is disposed on the electron control layer ECL. The second electrode CE is disposed in common to the pixels PX.

A thin film encapsulation layer TFE is disposed on the second electrode CE. The thin film encapsulation layer TFE is disposed in common to the pixels PX. The thin film encapsulation layer TFE may directly cover the second electrode CE. A capping layer covering the second electrode CE may be further disposed between the thin film encapsulation layer TFE and the second electrode CE. In this case, the thin film encapsulation layer TFE may directly cover the capping layer.

Figure 7:
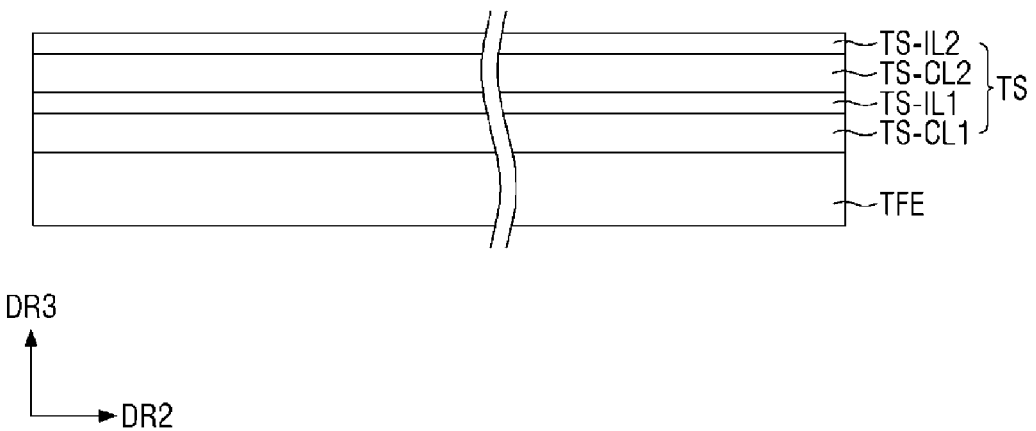
FIG. 7 is a cross-sectional view of an input sensing unit included in the display device of FIG. 2 according to some exemplary embodiments.
Figure 8:
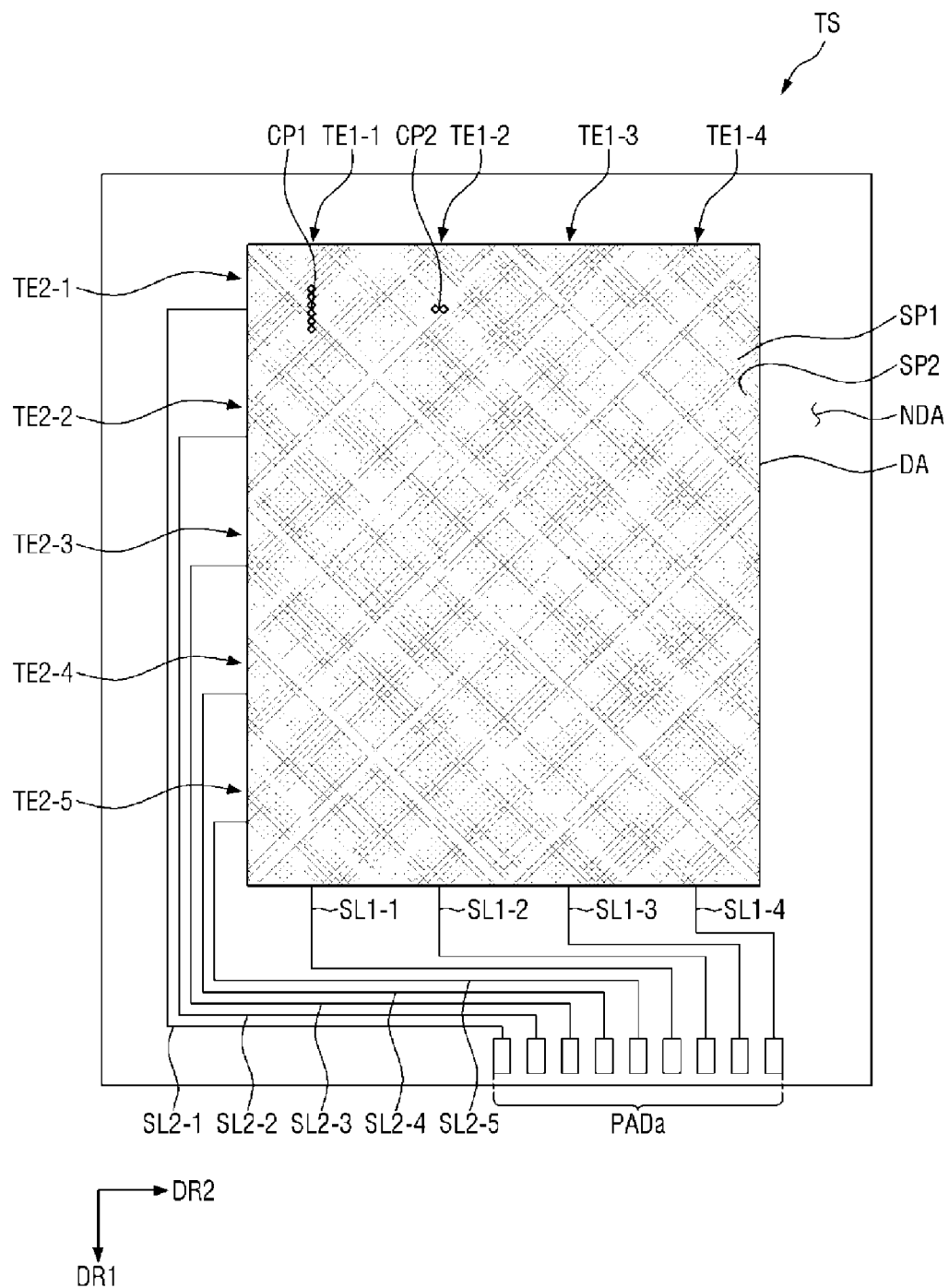
FIG. 8 is a plan view of the input sensing unit of FIG. 7 according to some exemplary embodiments.

FIG. 7 is a cross-sectional view of an input sensing unit included in the display device of FIG. 2 according to some exemplary embodiments. FIG. 8 is a plan view of the input sensing unit of FIG. 7 according to some exemplary embodiments.

Referring to FIG. 7, the input sensing unit TS includes a first conductive layer TS-CL1, a first insulating layer TS-IL1 (hereinafter, referred to as a first sensing insulating layer), a second conductive layer TS-CL2, and a second insulating layer TS-IL2 (hereinafter, referred to as a second sensing insulating layer). The first conductive layer TS-CL1 is disposed directly on the thin film encapsulation layer TFE. However, exemplary embodiments are not limited thereto, and another inorganic or organic layer may be disposed between the first conductive layer TS-CL1 and the thin film encapsulating layer TFE. Each of the first conductive layer TS-CL1 and the second conductive layer TS-CL2 may have a single-layer structure, or may have a multi-layer structure laminated along the third direction DR3. The conductive layer having the multi-layer structure may include at least two or more of transparent conductive layers and metal layers. The conductive layer having the multi-layer structure may include metal layers containing different metals. The transparent conductive layer may include indium tin oxide (ITO), indium zinc oxide (IZO), zinc oxide (ZnO), indium tin zinc oxide (ITZO), PEDOT, metal nanowires, or graphene. The metal layer may include molybdenum, silver, titanium, copper, aluminum, or an alloy of at least one of the aforementioned materials. For example, each of the first conductive layer TS-CL1 and the second conductive layer TS-CL2 may have a three-layer structure of titanium/aluminum/titanium.

Each of the first conductive layer TS-CL1 and the second conductive layer TS-CL2 includes a plurality of patterns. Hereinafter, it is assumed that the first conductive layer TS-CL1 includes first conductive patterns, and the second conductive layer TS-CL2 includes second conductive patterns. Each of the first conductive patterns and the second conductive patterns may include sensing electrodes and sensing signal lines.

Each of the first sensing insulating layer TS-IL1 and the second sensing insulating layer TS-IL2 may include an inorganic material or an organic material. The inorganic material may include at least one of aluminum oxide, titanium oxide, silicon oxide silicon oxynitride, zirconium oxide, and hafnium oxide. The organic material may include at least one of an acrylic resin, a methacrylic resin, a polyisoprene, a vinyl resin, an epoxy resin, a urethane resin, a cellulose resin, a siloxane resin, a polyimide resin, a polyamide resin, and a perylene resin.

Each of the first sensing insulating layer TS-IL1 and the second sensing insulating layer TS-IL2 may have a single-layer structure or a multi-layer structure. Each of the first sensing insulating layer TS-IL1 and the second sensing insulating layer TS-IL2 may have at least one of an inorganic layer and an organic layer. The inorganic layer and the organic layer may be formed by chemical vapor deposition.

The first sensing insulating layer TS-IL1 insulates the first conductive layer TS-CL1 and the second conductive layer TS-CL2, and the shape thereof is not limited. The shape of the first sensing insulating layer TS-IL1 may be changed according to the shapes of the first conductive patterns and the second conductive patterns. The first sensing insulating layer TS-IL1 may cover the entire thin film encapsulation layer TFE, or may include a plurality of insulation patterns. It is sufficient that the plurality of insulation patterns overlap first connection units CP1 or second connection units CP2 to be described later.

Although a two-layer input sensing unit TS is shown in FIG. 7, this is merely an exemplary example, and exemplary embodiments are not limited thereto. For example, a single-layer input sensing unit includes a conductive layer and an insulating layer covering the conductive layer. The conductive layer includes sensing electrodes and sensing signal lines connected to the sensing electrodes. The single-layer input sensing unit may acquire coordinate information in a self-capacitance manner.

Referring to FIG. 8, the input sensing unit TS may include first sensing electrodes TE1-1 to TE1-4 (or first to fourth driving electrodes), first sensing signal lines SL1-1 to SL1-4 (or first to fourth driving signal lines) connected to the first sensing electrodes TE1-1 to TE1-4, second sensing electrodes TE2-1 to TE2-5 (or first to fifth sensing electrodes), second sensing signal lines SL2-1 to SL2-5 (or first to fifth sensing signal lines) connected to the second sensing electrodes TE2-1 to TE2-5, and a pad unit PADa connected to the first sensing signal lines SL1-1 to SL1-4 and the second sensing signal lines SL2-1 to SL2-5. Although it is shown in FIG. 8 that the input sensing unit TS includes four first sensing electrodes TE1-1 to TE1-4 and five second sensing electrodes TE2-1 to TE2-5, this is merely an illustrative example, and exemplary embodiments are not limited thereto.

Each of the first sensing electrodes TE-1 to TE1-4 may have a mesh shape in which a plurality of sensing openings are defined. Each of the first sensing electrodes TE1-1 to TE1-4 includes a plurality of first sensing sensor units SP1 and a plurality of first connection units CP1. The first sensing sensor units SP1 are arranged along the first direction DR1. Each of the first connection units CP1 connects two adjacent first sensing sensor units SP1 among the first sensing sensor units SP1. The first sensing signal lines SL1-1 to SL1-4 may also have a mesh shape.

The second sensing electrodes TE2-1 to TE2-5 are insulated from the first sensing electrodes TE1-1 to TE1-4, and intersect with the first sensing electrodes TE1-1 to TE1-4. Each of the second sensing electrodes TE2-1 to TE2-5 may have a mesh shape in which a plurality of sensing openings are defined. Each of the second sensing electrodes TE2-1 to TE2-5 includes a plurality of second sensing sensor units SP2 and a plurality of second connection units CP2. The second sensing sensor units SP2 are arranged along the second direction DR2. Each of the second connection units CP2 connects two adjacent second sensing sensor units SP2 among the second sensing sensor units SP2. The second sensing signal lines SL2-1 to SL2-5 may also have a mesh shape.

The first sensing electrodes TE1-1 to TE1-4 are electrostatically connected to the second sensing electrodes TE2-1 to TE2-5. As sensing signals are applied to the first sensing electrodes TE1-1 to TE1-4, capacitors are formed between the first sensing sensor units SP1 and the second sensing sensor units SP2.

Some of the first sensing sensor units SP1, the first connection units CP1, the first sensing signal lines SL1-1 to SL1-4, the second sensing sensor units SP2, the second connection units CP2, and the second sensing signal lines SL2-1 to SL2-5 may be formed by patterning the first conductive layer TS-CL1 shown in FIG. 7, and others thereof may be formed by patterning the second conductive layer TS-CL2 shown in FIG. 7.

Heretofore, the input sensing unit TS in which the first connection units CP1 and the second connection units CP2 intersect each other has been exemplarily shown and described, but exemplary embodiments are not limited thereto. For example, each of the first connection units CP1 may be deformed into a V-shape so as not to overlap the second connection units CP2.

Further, heretofore, the first sensing sensor units SP1 and the second sensing sensor units SP2, each having a rhombus shape, have been exemplarily shown and described, but exemplary embodiments are not limited thereto.

Figure 9:
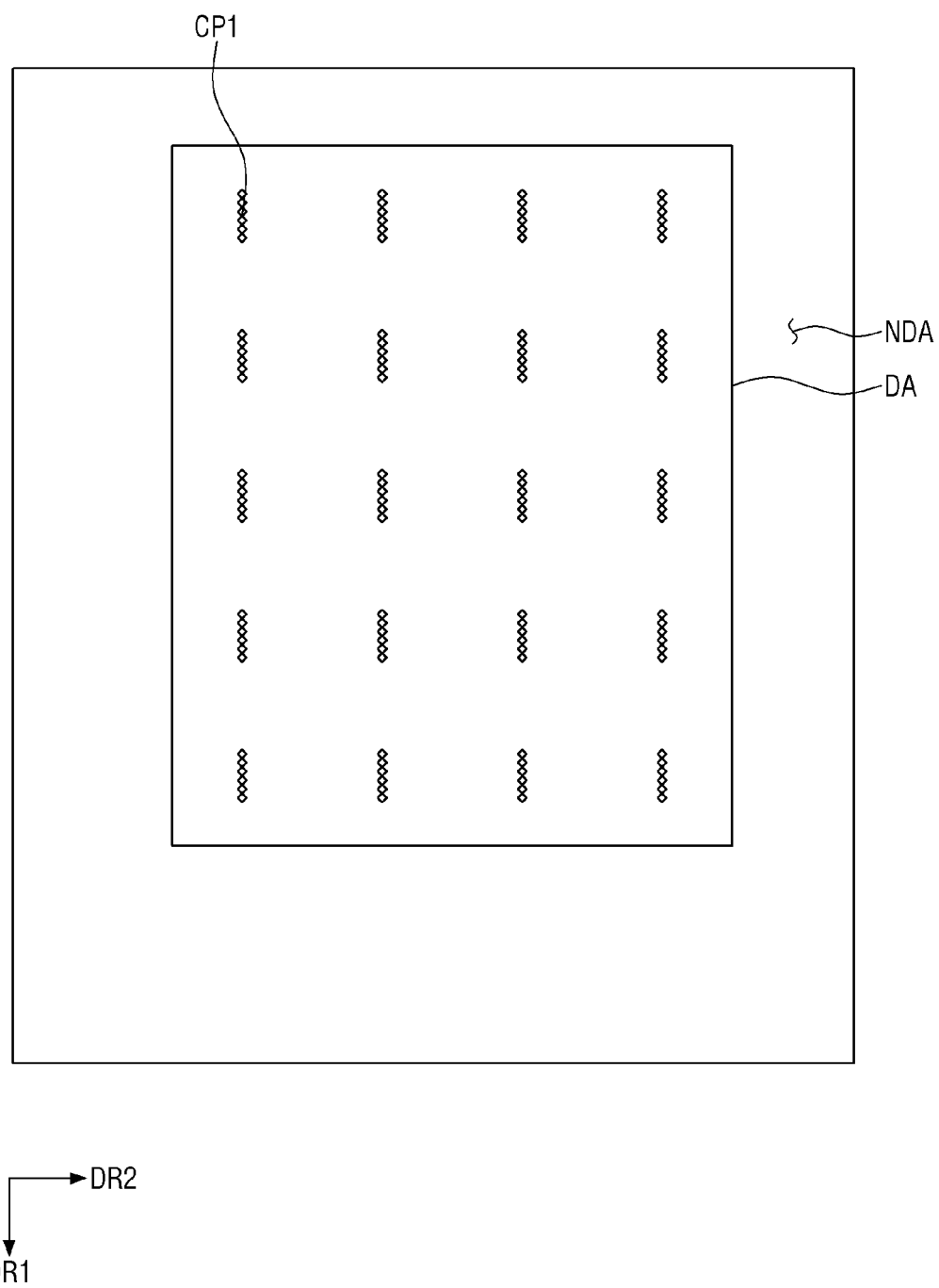
FIG. 9 is a plan view of a first conductive layer included in the input sensing unit of FIG. 7 according to some exemplary embodiments.
Figure 10:
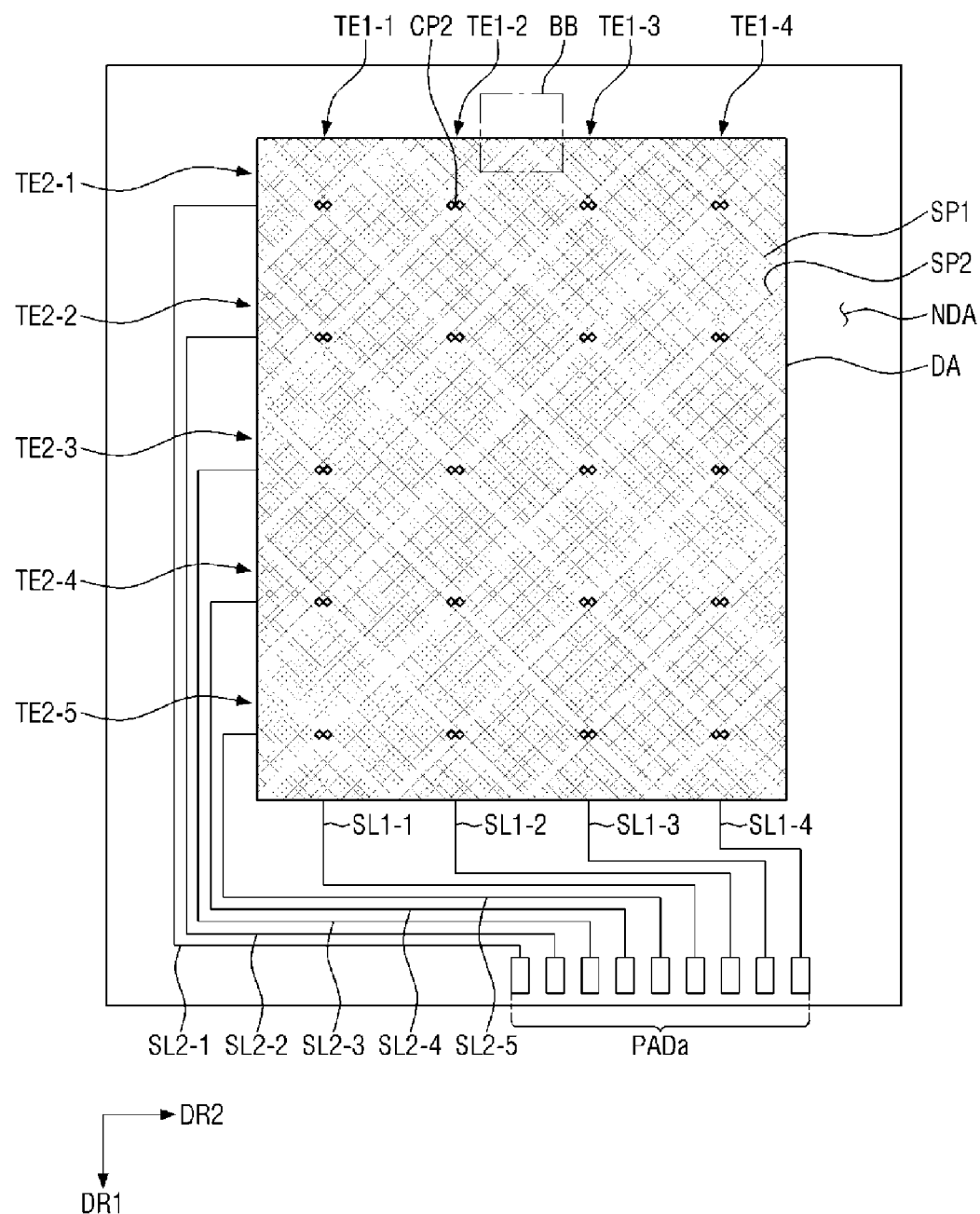
FIG. 10 is a plan view of a second conductive layer included in the input sensing unit of FIG. 7 according to some exemplary embodiments.
Figure 11:
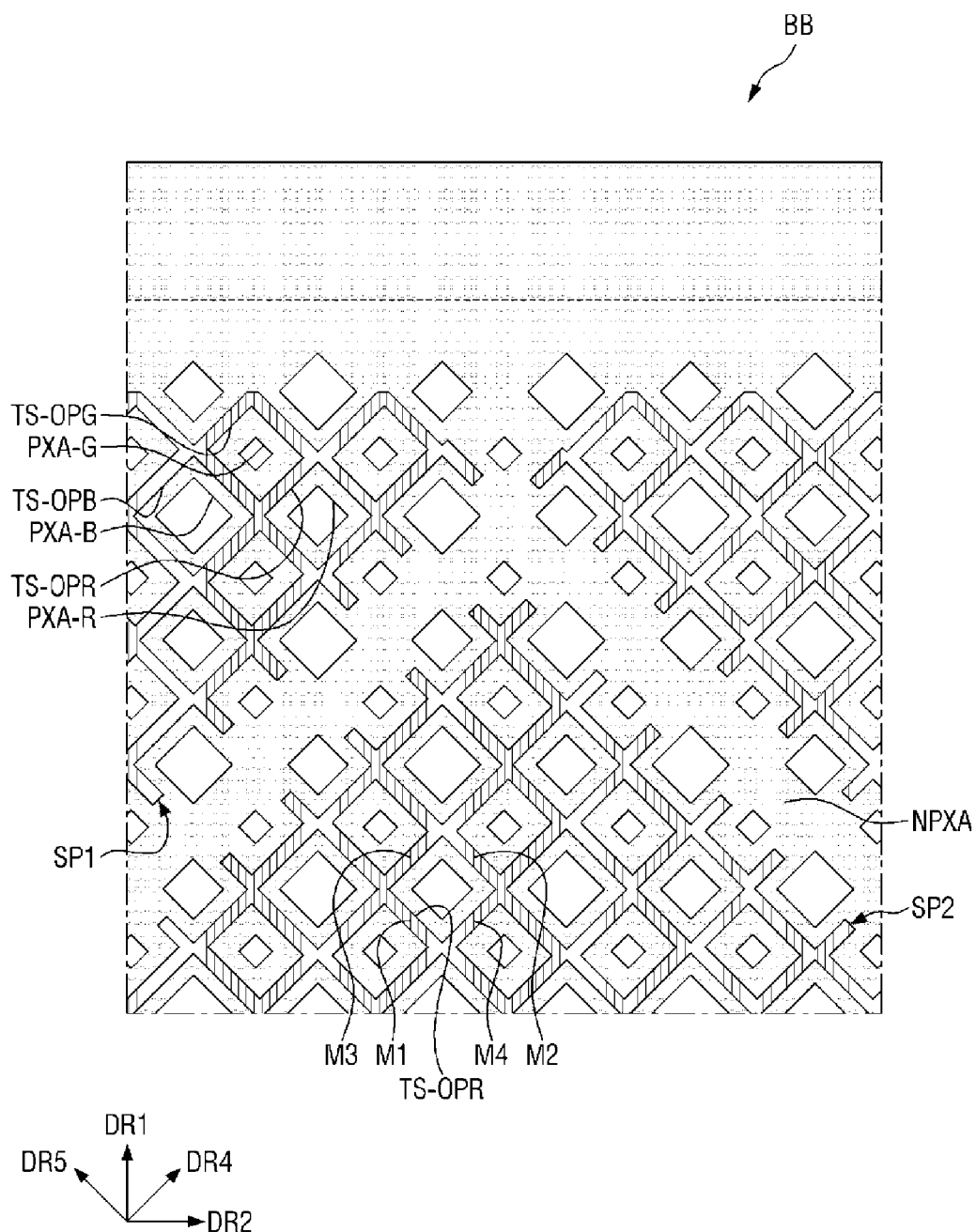
FIG. 11 is an enlarged view of an area BB of FIG. 10 according to some exemplary embodiments.

FIGS. 9 to 11 are referred to in order to describe a more detailed configuration of the input sensing unit TS.

FIG. 9 is a plan view of a first conductive layer included in the input sensing unit of FIG. 7 according to some exemplary embodiments. FIG. 10 is a plan view of a second conductive layer included in the input sensing unit of FIG. 7 according to some exemplary embodiments. FIG. 11 is an enlarged view of an area BB of FIG. 10 according to some exemplary embodiments.

Referring to FIG. 9, first conductive patterns are disposed on the thin film encapsulation layer TFE. The first conductive patterns may include first connection units CP1 (or bridge patterns). First connection units CP1 may be disposed directly on the thin film encapsulation layer TFE. The first connection units CP1 correspond to the first connection units CP1 shown in FIG. 8.

Although not shown in FIG. 10, a first sensing insulating layer TS-IL1 covering the first connection units CP1 is disposed on the thin film encapsulation layer TFE. Contact holes for partially exposing the first connection units CP1 are defined in the first sensing insulating layer TS-IL1. The contact holes may be formed by a photolithography process.

Referring to FIG. 10, second conductive patterns are disposed on the first sensing insulating layer TS-IL1. The second conductive patterns may include first sensing sensor units SP1, second connection units CP2, first sensing signal lines SL1-1 to SL1-4, second sensing sensor units SP2, and second sensing signal lines SL2-1 to SL2-5. Although not shown in FIG. 10, a second sensing insulating layer TS-IL2 covering the second conductive patterns is disposed s on the first sensing insulating layer TS-IL1.

In some exemplary embodiments, the first conductive patterns may include first sensing electrodes TE1-1 to TE1-4 and first sensing signal lines SL1-1 to SL1-4. The second conductive patterns may include second sensing electrodes TE2-1 to TE2-5 and second sensing signal lines SL2-1 to SL2-5. In this case, contact holes CNT are not defined in the first sensing insulating layer TS-IL1.

In some exemplary embodiments, the first conductive patterns and the second conductive patterns may be interchanged. That is, the second conductive patterns may include the first connection units CP1.

In some exemplary embodiments, the first conductive patterns may further include dummy signal lines corresponding to the first sensing signal lines SL1-1 to SL1-4 and the second sensing signal lines SL2-1 to SL2-5. The dummy signal lines and the sensing signal lines corresponding to each other may be connected to each other through contact holes penetrating the first sensing insulating layer TS-IL1. The dummy signal lines may lower the resistance of the sensing signal lines.

Referring to FIG. 11, the first sensing sensor unit SP1 and the second sensing sensor unit SP2 overlap the non-light emission area NPXA. A plurality of mesh holes TS-OPR, TS-OPG, and TS-OPB are defined in the first sensing sensor unit SP1 and the second sensing sensor unit SP2. The mesh holes TS-OPR, TS-OPG, and TS-OPB may correspond one-to-one to the light emitting areas PXA-R, PXA-G and PXA-B.

The light emitting areas PXA-R, PXA-G, and PXA-B may be substantially the same as the light emitting areas PXA of FIG. 6. Organic light emitting diodes OLED are disposed for each of the light emitting areas PXA-R, PXA-G, and PXA-B. The organic light emitting diodes OLED may include first organic light emitting diodes for generating first color light, second organic light emitting diodes for generating second color light, and third organic light emitting diodes for generating third color light.

The light emitting areas PXA-R, PXA-G, and PXA-B may have different areas depending on the color of light emitted from the light emitting layer EML (refer to FIG. 6) of the organic light emitting diode OLED (refer to FIG. 6). The areas of the light emitting areas PXA-R, PXA-G, and PXA-B may be determined depending on the kind of organic light emitting diodes. The light emitting areas PXA-R, PXA-G, and PXA-B may be divided into at least two groups.

Although FIG. 11 illustrates the light emitting areas PXA-R, PXA-G, and PXA-B divided into three groups, this is merely an illustrative example, and exemplary embodiments are not limited thereto. For example, the mesh holes TS-OPR, TS-OPG, and TS-OPB may be divided into two or four or more groups having different areas.

FIG. 11 illustrates the first mesh hole TS-OPR having a first area, the second mesh holes TS-OPG having a second area different from the first area, and the third mesh holes TS-OPG having a third area different from the first area and the second area. The areas of the mesh holes TS-OPR, TS-OPG, and TS-OPB may be determined depending on the kind of the organic light emitting diodes OLED overlapping the mesh holes TS-OPR, TS-OPG, and TS-OPB.

Each of the first sensing sensor unit SP1 and the second sensing sensor unit SP2 may include mesh lines defining the mesh holes TS-OPR, TS-OPG, and TS-OPB. The mesh lines may include first mesh lines extending in a fourth direction DR4 crossing the first direction DR1 and the second direction DR2 and second mesh lines extending in a fifth direction DR 5 crossing the fourth direction DR4. The line width of the first and second mesh lines may be several micrometers.

FIG. 11 shows four mesh line units M1, M2, M3, and M4 defining one mesh hole TS-OPR. The mesh line units constitute parts of the first mesh lines and the second mesh lines. The first mesh line unit M1 and the second mesh line unit M2 face each other in the fourth direction DR4, and the third mesh line unit M3 and the fourth mesh line unit M4 face each other in the fifth direction DR5. Although it is shown in FIG. 11 that the mesh holes TS-OPR, TS-OPG, and TS-OPB correspond one-to-one to the light emitting areas PXA-R, PXA-G, and PXA-B, exemplary embodiments are not limited thereto. For example, one mesh hole TS-OPR, TS-OPG, or TS-OPB may correspond to two or more light emitting areas PXA-R, PXA-G, and PXA-B.

Although it is illustrated in FIG. 11 that the areas of the light emitting areas PXA-R, PXA-G, and PXA-B are various, exemplary embodiments are not limited thereto. For example, the sizes of the light emitting areas PXA-R, PXA-G, and PXA-B may be equal to each other, and the sizes of the mesh holes TS-OPR, TS-OPG, and TS-OPB may also be equal to each other.

Figure 12:
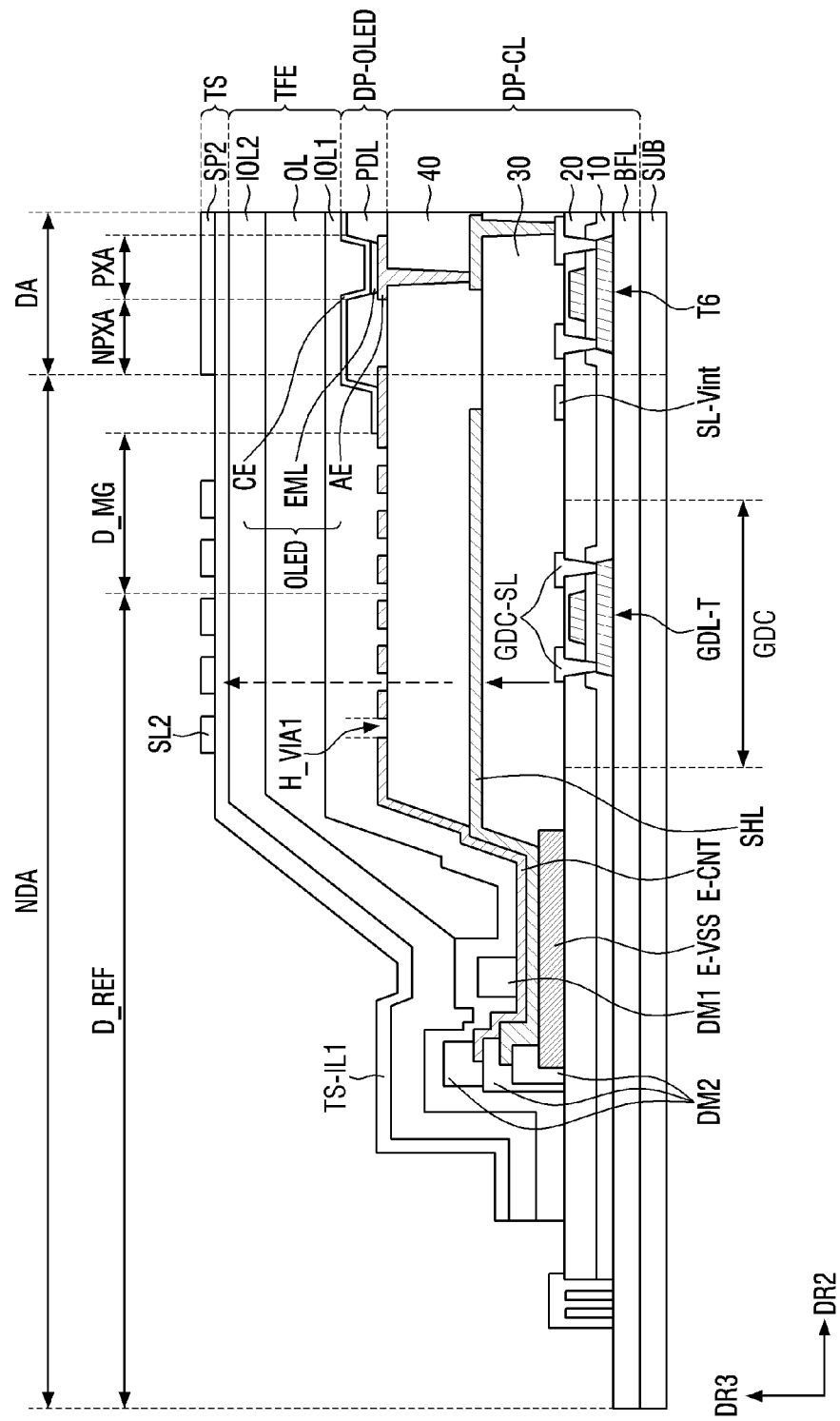
FIG. 12 is a cross-sectional view showing an example of a display module in which an area AA shown in FIG. 3 is enlarged according to some exemplary embodiments.
Figure 13:
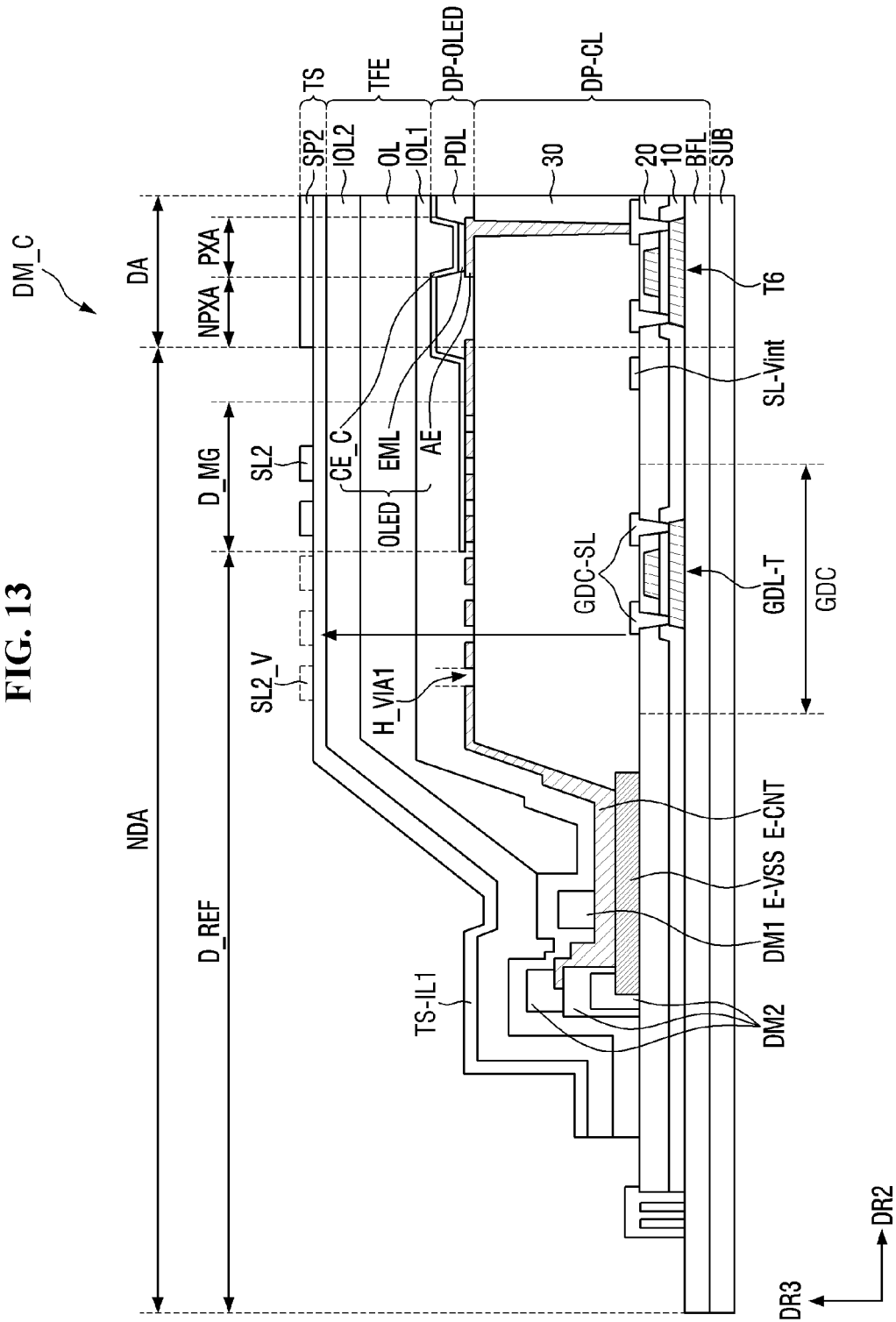
FIG. 13 is a cross-sectional view showing a comparative example of a display module.
Figure 14:
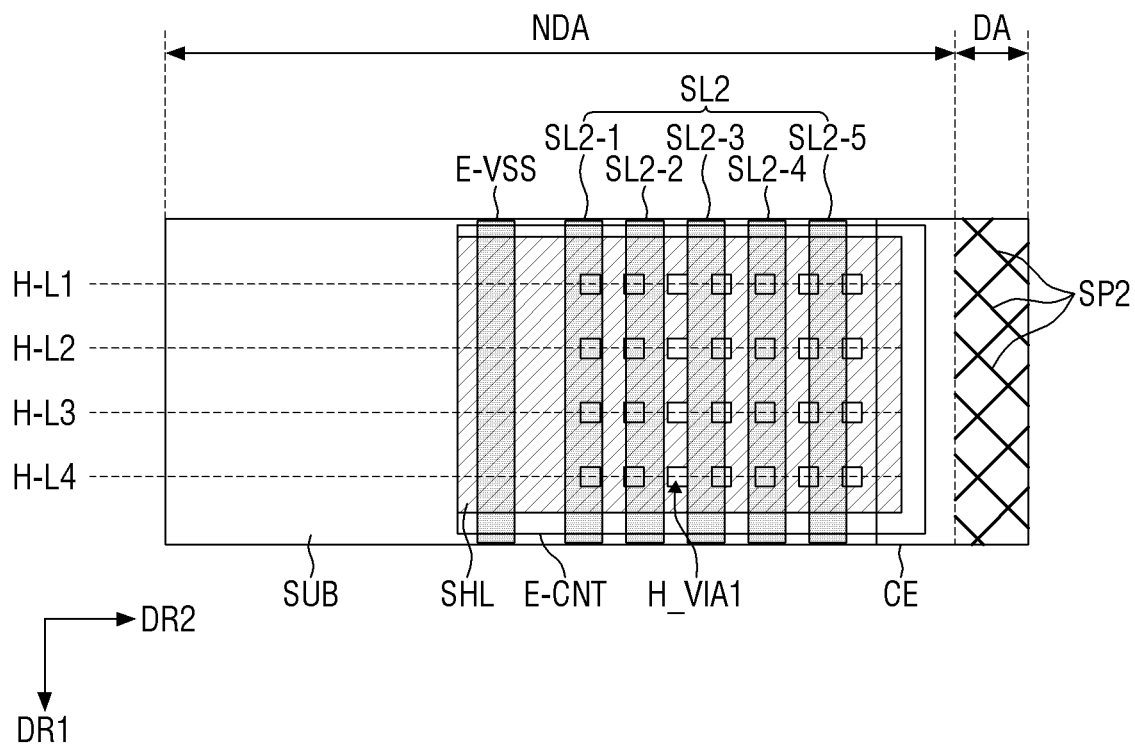
FIG. 14 is a plan view showing a shielding electrode, a connection electrode, and a second electrode included in the display module of FIG. 12 in an overlapping manner according to some exemplary embodiments.

FIG. 12 is a cross-sectional view showing an example of a display module in which the area AA shown in FIG. 3 is enlarged according to some exemplary embodiments. FIG. 13 is a cross-sectional view showing a comparative example of a display module. FIG. 13 shows an area corresponding to FIG. 12. FIG. 14 is a plan view showing a shielding electrode, a connection electrode, and a second electrode included in the display module of FIG. 12 in an overlapping manner according to some exemplary embodiments. FIG. 14 shows a planar area corresponding to the cross section of FIG. 12 according to some exemplary embodiments.

First, referring to FIG. 12, since a laminate structure of a circuit layer DP-CL, a display element layer DP-OLED, and a thin film encapsulating layer TFE, which are disposed in the display area DA, is substantially the same as the laminate structure having been described with reference to FIG. 6, a redundant description will not be repeated. For the convenience of explanation, a hole control layer HC and an electron control layer ECL will be omitted, but it should be understood that the display element layer DP-OLED includes the hole control layer HCL and the electron control layer ECL.

Similarly, since a laminate structure of an input sensing unit TS disposed in the display area DA, is substantially the same as the laminate structure having been described with reference to FIGS. 7 to 11, a redundant description will not be repeated. For the convenience of explanation, a first conductive layer TS-CL1 and a second sensing insulating layer TS-IL2 will be omitted, but it should be understood that the input sensing unit TS includes the first conductive layer TS-CL1 and the second sensing insulating layer TS-IL2.

It is illustrated in FIG. 12 that the thin film encapsulation layer TFE includes a first inorganic layer IOL1, an organic layer OL, and a second inorganic layer IOL2.

Hereinafter, the non-display area NDA will be mainly described.

The scan driving circuit GDC constituting the circuit layer DP-CL is disposed in the non-display area NDA. The scan driving circuit GDC includes at least one transistor GDC-T formed through the same process as the sixth transistor T6. The scan driving circuit GDC includes signal lines GDC-SL arranged on the same layer as the input electrode of the sixth transistor T6. The initialization voltage line SL-Vint and the power supply electrode E-VSS are also disposed on the same layer as the input electrode of the pixel transistor T6. Since the initialization voltage line SL-Vint, the power supply electrode E-VSS, and the input electrodes of the sixth transistor T6 are formed through the same process, they may have the same layer structure and may include the same material.

As having been described with reference to FIG. 4, the power supply electrode E-VSS is disposed outside the scan driving circuit GDC.

A shielding electrode SHL (or a shielding layer) is disposed on the third insulating layer 30. The shielding electrode SHL may be directly connected to the power supply electrode E-VSS, and may overlap at least a part of the scan driving circuit GDC. Further, the shielding electrode SHL may overlap at least a part of the second electrode CE to be described later or may partially overlap the second electrode CE. The shielding electrode SHL may be formed through the same process as the data line DL, and may include the same layer structure and the same material as the data pattern 410 (or the data line DL (refer to FIG. 6)). Further, the shielding electrode SHL may have the same thickness as the data pattern 410 (or the data line DL).

The shielding electrode SHL is disposed in at least one non-display area of the first non-display area NDA1, the third non-display area NDA3, and the fourth non-display area NDA4, which have been described with reference to FIG. 4. As shown in FIG. 4, the shielding electrode SHL may be disposed in the first non-display area NDA1, the third non-display area NDA3, and the fourth non-display area NDA4.

A connection electrode E-CNT is disposed on the fourth insulating layer 40. The connection electrode E-CNT connects the power supply electrode E-VSS (or the shielding electrode SHL) to the second electrode CE. The connection electrode E-CNT may overlap the power supply electrode E-VSS, may overlap the shielding electrode SHL, and may overlap the second electrode CE. The connection electrode E-CNT transfers the second power supply voltage from the power supply electrode E-VSS to the second electrode CE. Since the connection electrode E-CNT is formed through the same process as the first electrode AE, the connection electrode E-CNT may include the same layer structure and the same material as the first electrode AE. The connection electrode E-CNT and the first electrode AE may have the same thickness.

Similarly to the shielding electrode SHL, the connection electrode E-CNT is disposed in at least one non-display area of the first non-display area NDA1, the third non-display area NDA3, and the fourth non-display area NDA4. For example, the connection electrode E-CNT may be disposed in the first non-display area NDA1, the third non-display area NDA3, and the fourth non-display area NDA4.

A plurality of first through-holes H_VIA1 are defined in the connection electrode E-CNT. The first through-holes H_VIA1 discharge gases generated in the process of forming the fourth insulating layer 40.

In some exemplary embodiments, the first through-holes H_VIA1 of the connection electrode E-CNT may overlap the shielding electrode SHL, or may be covered by the shielding electrode SHL. For reference, when the connection electrode E-CNT includes the first through-holes H_VIA1, noise propagates from the scan driving circuit GDC to the input sensing unit TS through the first through-holes H_VIA1 of the connection electrode E-CNT, and the noise influences the sensing signal lines SL2, thereby deteriorating the sensitivity of the input sensing unit TS. Therefore, the shielding electrode SHL (that is, the shielding electrode SHL connected to the power supply voltage E-VSS) may cover the first through-holes H_VIA1 of the connection electrode E-CNT on the basis of the scan driving circuit GDC, thereby blocking noise propagated from the scan driving circuit GDC to the input sensing unit TS through the first through-holes H_VIA1 of the connection electrode E-CNT. Therefore, the deterioration in sensitivity of the input sensing unit TS due to the noise may be prevented.

The second electrode CE may overlap at least a part of the shielding electrode SHL, or may partially overlap the shielding electrode SHL. In the area where the connection electrode E-CNT does not overlap the shielding electrode SHL, noise may be propagated from the scan driving circuit GDC to the input sensing unit TS through some of the first through-holes H_VIA1 of the connection electrode E-CNT (refer to FIG. 15 to be described later). As such, the second electrode CE may cover the area where the shielding electrode SHL does not overlap the connection electrode E-CNT, thereby blocking noise propagated from the scan driving circuit GDC to the input sensing unit TS.

For reference, the second electrode CE is to be spaced apart from the edge of the display module DM by a predetermined distance D_REF or more in consideration of tolerances (or process errors, e.g., errors that may occur during the formation of sub-configurations). Since the display module DM includes the shielding electrode SHL, the second electrode CE may be spaced apart from the edge of the display module DM with a margin D_MG that is more than the predetermined distance D_REF, and the sensing signal lines SL2 of the input sensing unit TS may be arranged under more relaxed conditions. That is, since the display module DM includes the shielding electrode SHL, the second electrode CE and the sensing signal lines SL2 may be arranged under more relaxed conditions (that is, more relaxed positions and restrictions). FIG. 13 is referred to in relation with the arrangement conditions of the second electrode CE and the sensing signal lines SL2.

Referring to FIG. 13, a display module DM_C according to the comparative example may not include the shielding electrode SHL. The second electrode CE_C may be spaced apart from the edge of the display module DM_C by a predetermined distance D_REF, and may cover some of the first through-holes H_VIA1 of the connection electrode E-CNT. In this case, others of the first through-holes H_VIA1 (that is, through-holes arranged in an area within a predetermined distance D_REF from the edge of the display module DM_C) of the connection electrode E-CNT may not be covered by the second electrode CE. Therefore, noise may be propagated from the scan driving unit GDC to virtual sensing signal lines SL2_V through the others of the first through-holes H_VIA1, and the sensitivity of the input sensing unit TS may be deteriorated by the noise. To exclude the influence of noise, the virtual sensing signal lines SL2_V may not be formed, and the second sensing signal lines SL2 may be disposed only in an overlap area (that is, an area where the first through-holes H_VIA1 of the connection electrode E-CNT are covered by the second electrode CE_C). A short circuit between the second sensing signal lines SL2 may occur as the overlap area in which the second sensing signal lines SL2 may be arranged is relatively reduced, or the resistance of the second sensing signal lines SL2 may decrease as the widths of the second sensing signal lines SL2 decreases, and the sensitivity of the input sensing unit TS may deteriorate.

Accordingly, the display module DM according to various exemplary embodiments may cover the first through-holes H_VIA1 of the connection electrode E-CNT using the shielding electrode SHL, thereby not only preventing and alleviating the deterioration in sensitivity of the input sensing unit TS, but also alleviating the restriction in arrangement position of the second electrode CE and the sensing signal lines SL2.

Referring again to FIG. 12, dams DM1 and DM2 may be disposed in the non-display area NDA. The dams DM1 and DM2 may include a first dam DM1 and a second dam DM2. The first dam DM1 and the second dam DM2 may be spaced apart from each other in the second direction DR2. Although not shown in FIG. 12, the first dam DM1 and the second dam DM2 may be disposed on the plane to surround the display area DA. The first dam DM1 and the second dam DM2 may be disposed in at least one of the first non-display area NDA1, the third non-display area NDA3, and the fourth non-display area NDA4.

The first dam DM1 may be disposed on the power supply electrode E-VSS. The first dam DM1 may be a single layer, and may be formed simultaneously with the pixel defining layer PDL. Since the first dam DM1 is formed by the same process as the pixel defining layer PDL, the first dam DM1 may have the same thickness as the pixel defining layer PDL and may include the same material. In some exemplary embodiments, the first dam DM1 may have a smaller thickness than the pixel defining layer PDL.

The second dam DM2 may be disposed outside the first dam DM1. For example, the distance between the second dam DM2 and the display area DA may be larger than the distance between the first dam DM1 and the display area DA.

The second dam DM2 may cover a part of the power supply electrode E-VSS. The second dam DM2 may have a multi-layer structure. The lower portion of the second dam DM2 may be formed simultaneously with the third insulating layer 30, the central portion thereof may be formed simultaneously with the fourth insulating layer 40, and the upper portion thereof may be formed simultaneously with the pixel defining layer PDL.

The first inorganic layer IOL1 may cover the first dam DM1 and the second dam DM2. The edge of the first inorganic layer IOL1 may contact the second insulating layer 20. The organic layer OL may overlap the circuit elements (for example, the transistor GDC-T of the scan driving circuit GDC), and the edge of the organic layer OL may overlap the first dam DM1 and the second dam DM2. In some exemplary embodiments, the edge of the organic layer OL is not disposed outside the second dam DM2. The second inorganic layer IOL2 may overlap the first dam DM1 and the second dam DM2. The edge of the second inorganic layer IOL2 may contact the first inorganic layer IOL1.

The first sensing insulating layer TS-IL1 may overlap the first dam DM1 and the second dam DM2. The edge of the first sensing insulating layer TS-IL1 may contact the second inorganic layer IOL2.

At least some of the sensing signal lines SL2 disposed on the first sensing insulating layer TS-IL1 overlap the shielding electrode SHL. All of the sensing signal lines SL2 need not overlap the shielding electrode SHL, and some of the sensing signal lines SL2 are sufficient to overlap the shielding electrode SHL.

Referring to FIG. 14, the first through-holes H_VIA1 of the connection electrode E-CNT define a plurality of rows H-L1 to H-L4, and the plurality of rows H-L1 to H-L4 are arranged in the first direction DR1. The plurality of rows H-L1 to H-L4 may include holes (that is, first through-holes H_VIA1) arranged in the second direction DR2, and the plurality of rows H-L1 to H-L4 may include the same number of holes. However, exemplary embodiments are not limited thereto. For example, the plurality of rows H-L1 to H-L4 may include different numbers of holes. The planar shape of each of the plurality of first through-holes H_VIA1 is rectangular, but is not limited thereto.

The holes in the first row H-L1 of the plurality of rows H-L1 to H-L4 may be defined as first holes, and the holes in the second row H-L2 of the plurality of rows H-L1 to H-L4 may be defined as second holes. The holes in the third row H-L3 of the plurality of rows H-L1 to H-L4 may be defined as third holes. The first row H-L1 and the third row H-L3 may include the same number of holes. The first holes, the second holes, and the third holes may be aligned. However, exemplary embodiments are not limited thereto. For example, the first holes and the third holes may be aligned, and the second holes may be disposed between the first holes.

Figure 15:
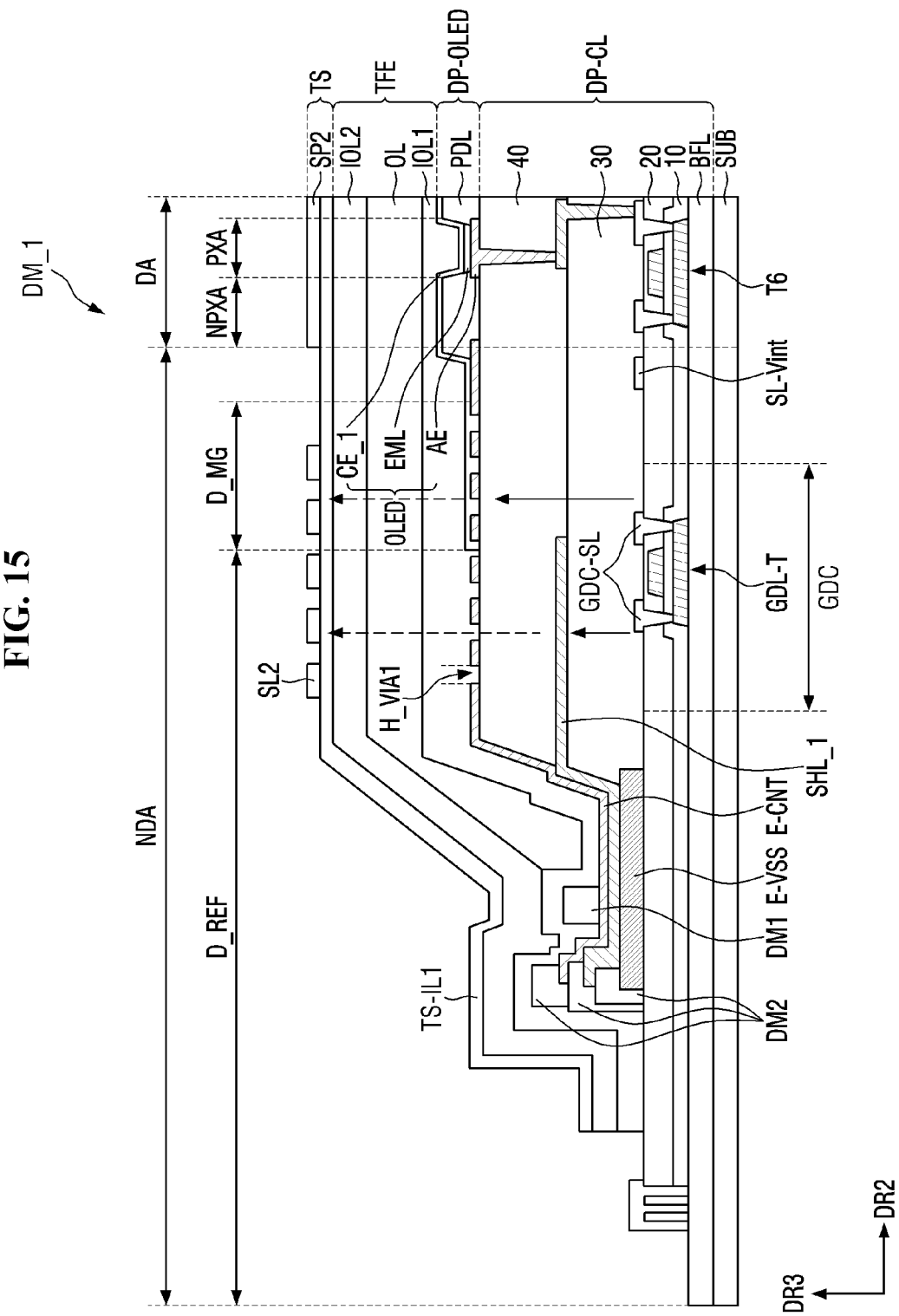
FIG. 15 is a cross-sectional view showing another example of a display module in which the AA area shown in FIG. 3 is enlarged according to some exemplary embodiments.

FIG. 15 is a cross-sectional view showing another example of a display module in which the area AA shown in FIG. 3 is enlarged according to some exemplary embodiments.

Referring to FIGS. 12 and 15, a display module DM_1 is different from the display module DM of FIG. 12 in that the display module DM_1 includes a shielding electrode SHL_1 and a second electrode CE_1.

The shielding electrode SHL_1 may be substantially the same as the shielding electrode SHL having been described with reference to FIG. 12, except for the area in which the shielding electrode SHL_1 is disposed. Therefore, a redundant description will not be repeated.

The shielding electrode SHL_1 may partially overlap the scan driving circuit GDC. That is, the shielding electrode SHL_1 may cover only a part of the scan driving circuit GDC (for example, a portion adjacent to the edge of the display module DM). The data line DL (refer to FIG. 4) may be disposed on the third conductive layer 400 (refer to FIG. 6), that is, on the third insulating layer 30. To prevent the disconnection with the data line DL, the shielding electrode SHL_1 may be spaced apart from the display area DA by a predetermined distance. In this case, the shielding electrode SHL_1 may be disposed so as to overlap only a part of the scan driving circuit GDC.

The second electrode CE_1 may be substantially the same as the second electrode CE having been described with reference to FIGS. 6 and 12, except for the position at which the second electrode CE_1 is disposed. Therefore, a redundant description will not be repeated.

As shown in FIG. 15, the second electrode CE_1 may extend from the edge of the display module DM_1 by a predetermined distance D_REF. Since the second electrode CE_1 partially overlaps the shielding electrode SHL_1, the second electrode CE_1, together with the shielding electrode SHL_1, may block noise propagated from the scan driving circuit GDC (or the circuit element layer DP-CL) to the input sensing unit TS.

Figure 16:
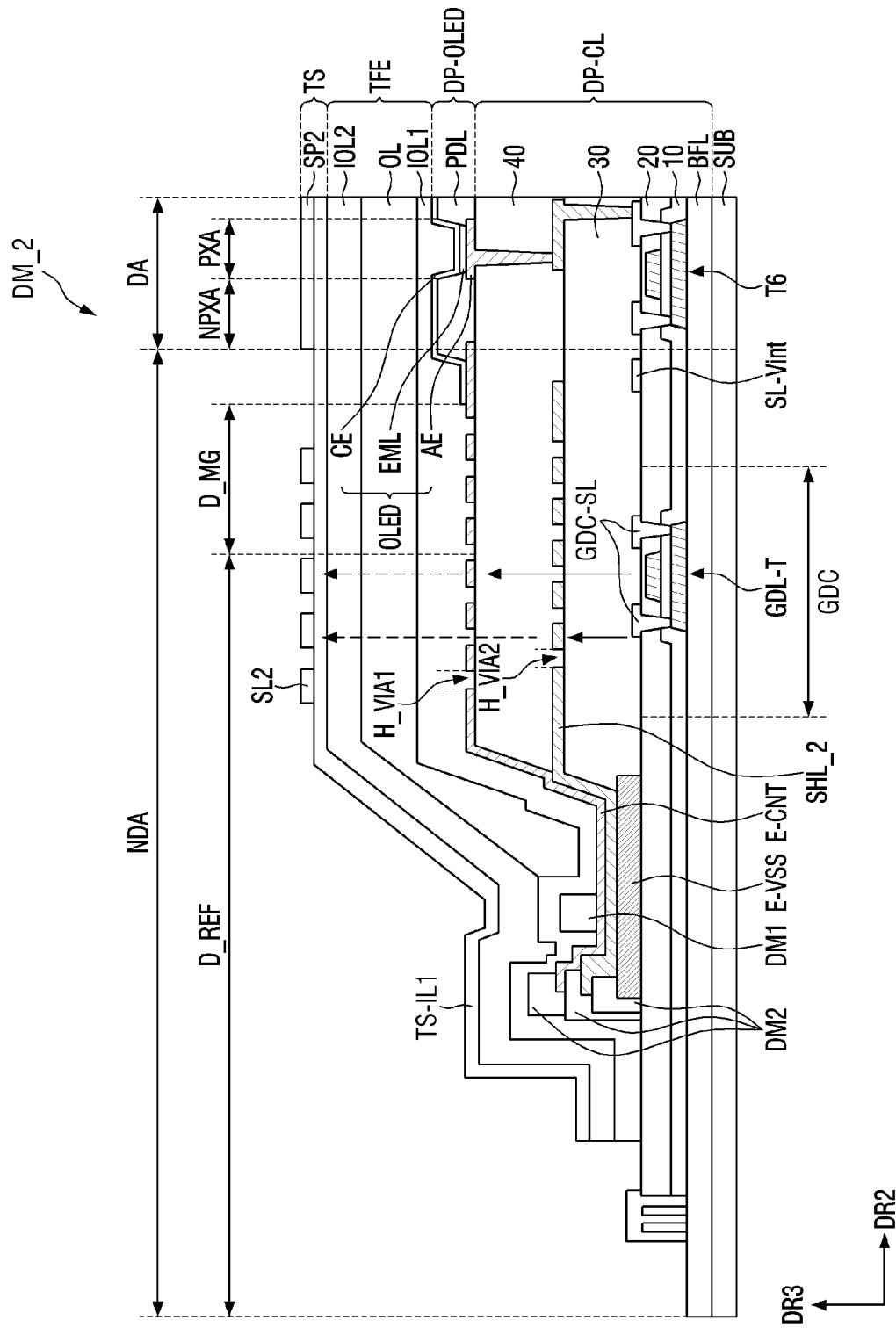
FIG. 16 is a cross-sectional view showing still another example of a display module in which the area AA shown in FIG. 3 is enlarged according to some exemplary embodiments.
Figure 17:
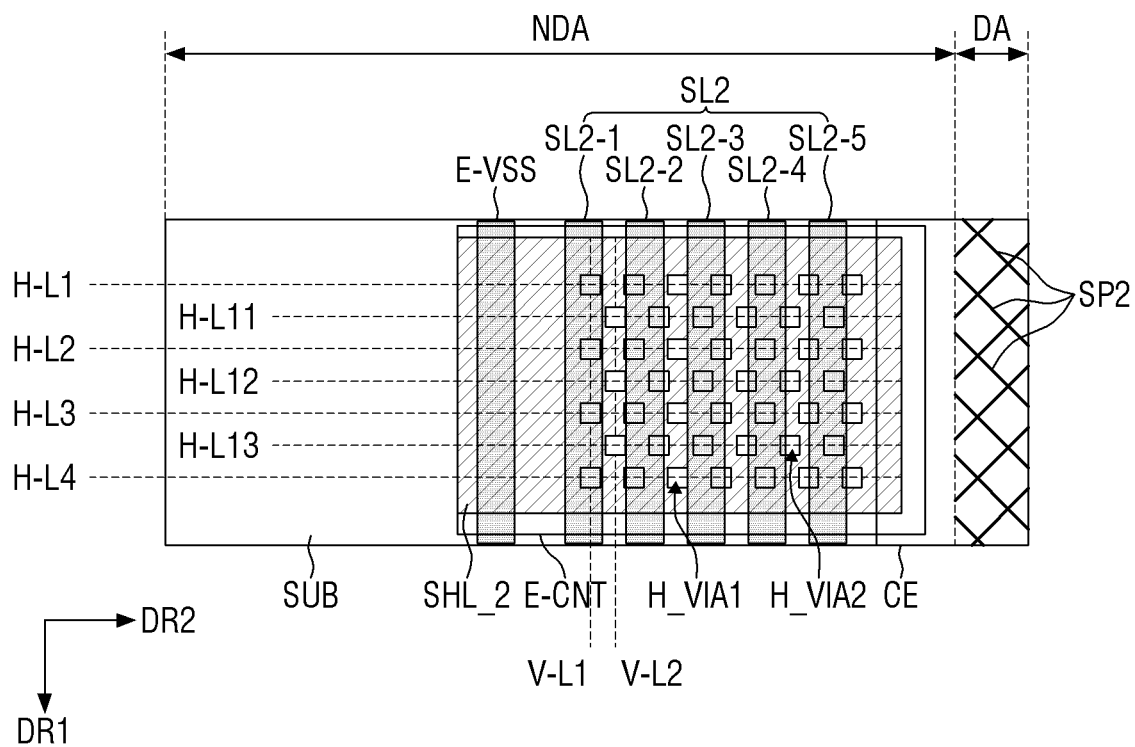
FIG. 17 is a plan view showing a shielding electrode, a connection electrode, and a second electrode included in the display module of FIG. 16 in an overlapping manner according to some exemplary embodiments.

FIG. 16 is a cross-sectional view showing still another example of a display module in which the area AA shown in FIG. 3 is enlarged according to some exemplary embodiments. FIG. 17 is a plan view showing a shielding electrode, a connection electrode, and a second electrode included in the display module of FIG. 16 in an overlapping manner according to some exemplary embodiments. FIG. 17 shows an area corresponding to the cross-section of FIG. 16.

Referring to FIGS. 12, 14, 16, and 17, a display module DM_2 of FIGS. 16 and 17 is different from the display module DM of FIGS. 12 and 14 in that the display module DM_2 includes a shielding electrode SHL_2. The shielding electrode SHL_2 may be substantially the same as the shielding electrode SHL having been described with reference to FIG. 12, except for the inclusion of second through-holes H_VIA2 in the shielding electrode SHL_2. Therefore, a redundant description will not be repeated.

A plurality of second through-holes H_VIA2 are defined in the shielding electrode SHL_2. The second through-holes H_VIA2 discharge the gases generated in the process of forming the third insulating layer 30. That is, when the third insulating layer 30 includes an organic material, gases are generated in the process of forming the third insulating layer 30, and the gases are discharged to the outside through the second through-holes H_VIA2.

The second through-holes H_VIA2 of the shielding electrode SHL_2 may be covered by the connection electrode E-CNT. The first through-holes H_VIA1 of the connection electrode E-CNT may not overlap the second through-holes H_VIA2 of the shielding electrode SHL 2.

Similarly to the first through-holes H_VIA1 of the connection electrode E-CNT, noise may be propagated from the scan driving circuit GDC to the input sensing unit TS through the second through-holes H_VIA2 of the shielding electrode SHL_2, but the connection electrode E-CNT covers the second through-holes H_VIA2 of the shielding electrode SHL_2 or the first through-holes H_VIA1 of the connection electrode E-CNT are arranged so as not to overlap the second through-holes H_VIA2 of the shielding electrode SHL_2, thereby blocking the propagation of noise.

Referring to FIG. 17, it is shown that the connection electrode E-CNT and the shielding electrode SHL_2 overlap each other. Since the first through-holes H_VIA1 of the connection electrode E-CNT are the same as those of the first through-holes H_VIA1 having been described with reference to FIG. 12, a redundant description will not be repeated.

The second through-holes H_VIA2 of the shielding electrode SHL_2 may be arranged to be staggered with the first through-holes H_VIA1 of the connection electrode E-CNT.

The second through-holes H_VIA2 of the shielding electrode SHL_2, similarly to the first through-holes H_VIA1 of the connection electrode E-CNT, define a plurality of rows H-L11 to H-L13, and the plurality of rows H-L11 to H-L13 are arranged in the first direction DR1. The plurality of rows H-L11 to H-L13 may include holes arranged in the second direction DR2, and the plurality of rows H-L11 to H-L13 may include different numbers of holes. The planar shape of each of the plurality of second through-holes H_VIA2 is the same as or similar to the planar shape of each of the plurality of first through-holes H_VIA1, but exemplary embodiments are not limited thereto.

The rows H-L11 to H-L13 of the shielding electrode SHL_2 may be disposed between the rows H-L1 to H-L4 of the connection electrode E-CNT. That is, the rows H-L11 to H-L13 of the shielding electrode SHL_2 and the rows H-L1 to H-L4 of the connection electrode E-CNT are arranged alternately (or alternatively). For instance, the rows H-L11 to H-L13 of the shielding electrode SHL_2 and the rows H-L1 to H-L4 of the connection electrode E-CNT may be staggered with one another. Further, when the second through-holes H_VIA2 of the shielding electrode SHL_2 define a plurality of columns V-L2, or when the first through-holes H_VIA1 of the connection electrode E-CNT define a plurality of columns V-L1, the columns V-L2 of the shielding electrode SHL_2 and the columns V-L1 of the connection electrode E-CNT may be alternately arranged in the second direction DR2. That is, on the plane, the second through-holes H_VIA2 of the shielding electrode SHL_2 and the first through-holes H_VIA1 of the connection electrode E-CNT may have a checkerboard structure or a lattice structure, and may be arranged so as not to overlap each other.

The connection electrode E-CNT may be connected to the power supply electrode E-VSS and the second electrode CE to lower the total resistance and reduce the voltage drop of the second power supply voltage ELVSS. As the area of the second through-holes H_VIA2 of the connection electrode E-CNT decreases, the total resistance of the connection electrode E-CNT (and the voltage drop of the second power supply voltage ELVSS) may decrease. As such, the connection electrode E-CNT may have a mesh structure.

Also, since the shielding electrode SHL_2 is connected to the power supply electrode E-VSS, but is not directly connected to the second electrode CE, the shape of the shielding electrode SHL_2 (or the shape of each of the second through-holes H_VIA2 of the shielding electrode SHL_2) may be free (e.g., subject to less design constraints) as compared to that of each of the first through-holes H_VIA1 of the connection electrode E-CNT.

Figure 18:
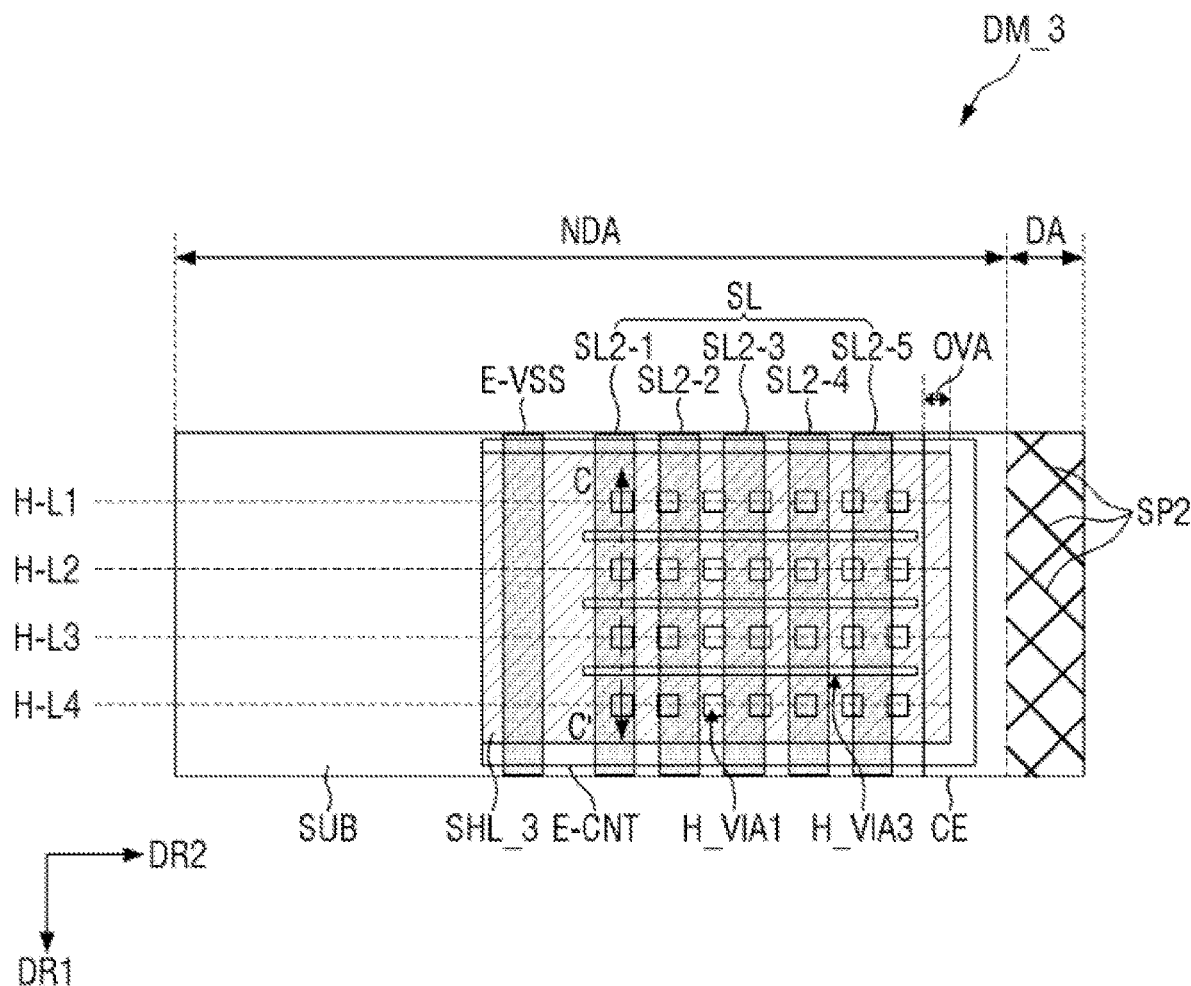
FIG. 18 is a plan view showing still another example of the display module of FIG. 12 according to some exemplary embodiments.
Figure 19:
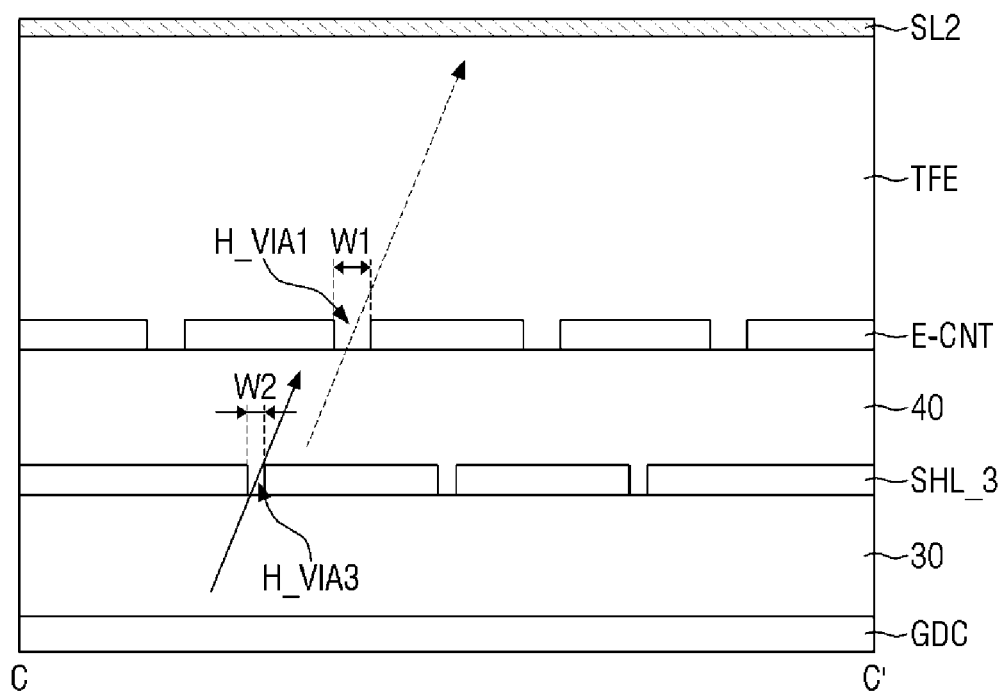
FIG. 19 is a cross-sectional view showing an example of a display module taken along sectional line C-C' in FIG. 18 according to some exemplary embodiments.
Figure 20:
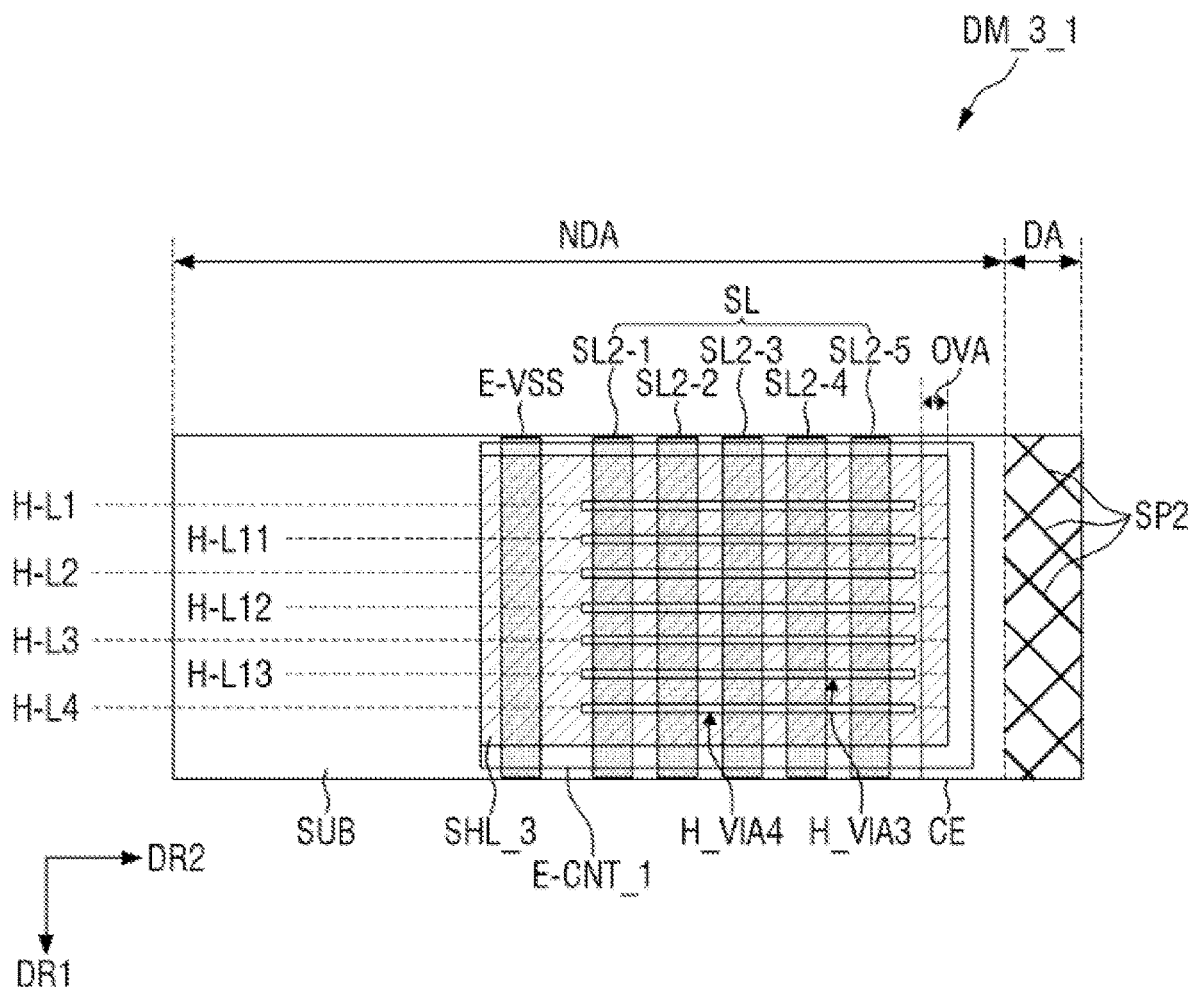
FIG. 20 is a plan view showing still another example of the display module of FIG. 12 according to some exemplary embodiments.

FIG. 18 is a plan view showing still another example of the display module of FIG. 12 according to some exemplary embodiments. FIG. 19 is a cross-sectional view showing an example of a display module taken along sectional line C-C' in FIG. 18 according to some exemplary embodiments. FIG. 20 is a plan view showing still another example of the display module of FIG. 12 according to some exemplary embodiments. It is shown in FIGS. 18 and 20 (the depictions of which correspond with FIG. 14), that a shielding electrode SHL_3, a connection electrode E-CNT or E-CNT_1, and a second electrode CE, which are included in a display module DM_3 or DM_3_1, overlap each other.

First, referring to FIGS. 18 to 20, a display module DM_3 of FIG. 18 or a display module DM_3_1 is different from the display module DM of FIG. 14 in that the display module DM_3 or DM_3_1 includes a shielding electrode SHL_3. The shielding electrode SHL_3 may be substantially the same as the shielding electrode SHL_2 having been described with reference to FIG. 16, except for the inclusion of third through-holes H_VIA3 in shielding electrode SHL_3 versus second through-holes H_VIA2 in shielding electrode SHL_2. Therefore, a redundant description will not be repeated.

A plurality of third through-holes H_VIA3 are defined in the shielding electrode SHL_3. The third through-holes H_VIA3 of the shielding electrode SHL_3 may be covered by the connection electrode E-CNT or E-CNT_1. The third through-holes H_VIA3 of the shielding electrode SHL_3 may be arranged to be staggered with the first through-holes H_VIA1 in connection electrode E-CNT or the fourth through-holes H_VIA4 in connection electrode E-CNT_1. For example, the third through-holes H_VIA3 may be disposed between the rows H-L1 to H-L4 of the connection electrode E-CNT or E-CNT_1.

Each of the third through-holes H_VIA3 may have a rectangular shape where the length in the second direction DR2 is greater than the width in the first direction DR1. For example, each of the third through-holes H_VIA3 is a slit, and only one third through-hole H_VIA3 may be disposed in one row. Each of the third through-holes H_VIA3 may correspond to all of the first through-holes H_VIA1 included in one row (for example, the first row H-L1) of the connection electrode E-CNT or each of the fourth through-holes H_VIA4 included in one row (for example, the first row H-L1) of the connection electrode E-CNT_1.

With respect to at least the display module DM_3, the second width W2 of each of the third through-holes H_VIA3 in the first direction DR1 may be smaller than the first width W1 of each of the first through-holes H_VIA1 in the first direction DR1. However, since each of the third through-holes H_VIA3 has a shape elongated in the second direction DR2, the area of each of the third through-holes H_VIA3 is greater than or equal to the total area of the first through-holes H_VIA1 included in one row (for example, the first row H-L1) of the connection electrode E-CNT. Since each of the third through-holes H_VIA3 has a relatively large area, the gases generated in the process of forming the third insulating layer 30 may be discharged more easily through the third through-holes H_VIA3, and noise propagated from the scan driving circuit GDC towards the input sensing unit TS may be more effectively blocked.

As shown in FIG. 19, noise may be propagated from the scan driving circuit GDC in an oblique direction DRD. When the noise is propagated in the oblique direction DRD, as the propagation path of the noise becomes relatively longer, the noise is attenuated, but the attenuated noise may affect the input sensing unit TS (or the sensing signal lines SL2).

As the second width W2 of each of the third through-holes H_VIA3 decreases, the range angle (that is, propagation range angle) at which noise can be propagated from the scan riving circuit GDC through the third through-holes H_VIA3 may become narrow, and in the corresponding range (that is, range corresponding to the range angle), the noise passing through the third through-holes H_VIA3 may be blocked by the connection electrode E-CNT. The range angle at which noise is propagated through the third through-holes H_VIA3 may be determined by the thickness of the shielding electrode SHL_3, the second width W2 of each of the third through-holes H_VIA3, the thickness of the fourth insulating layer 40 (that is, the thickness in the third direction DR3), and the like. As the thickness of the shielding electrode SHL_3 increases, as the second width W2 of each of the third through-holes H_VIA3 decreases, and as the thickness of the fourth insulating layer 40 (that is, the thickness in the third direction DR3) decreases, the range angle of the noise may be reduced. However, the thickness of the shielding electrode SHL_3 and the thickness of the fourth insulating layer 40 (that is, the thickness in the third direction DR3) may be predetermined by other circuit elements (for example, transistors and pixels PX formed in the display area DA) or the like. Therefore, the range angle of noise may be reduced by reducing the second width W2 of each of the third through-holes H_VIA3 (that is, the second width W2 that can be independently determined).

However, as the second width W2 of each of the third through-holes H_VIA3 decreases, the area of each of the third through-holes H_VIA3 may decrease, and thus, gas may not be as easily discharged. Therefore, considering the ease of gas discharge, the second width W2 of each of the third through-holes H_VIA3 may be 0.3 times to 0.7 times, e.g., 0.4 times to 0.6 times, such as about 0.5 times the first width W1 of each of the first through-holes H_VIA1.

Although it is illustrated in FIG. 18 that the shielding electrode SHL_3 includes the slit-type third through-holes H_VIA3, exemplary embodiments are not limited thereto. For example, the connection electrode E-CNT may include slit-type first through-holes H_VIA1. As another example, as shown in FIG. 20, the shielding electrode SHL_3 may include slit-type third through-holes H_VIA3, and the connection electrode E-CNT_1 may include slit-type fourth through-holes H_VIA4.

Figure 21:
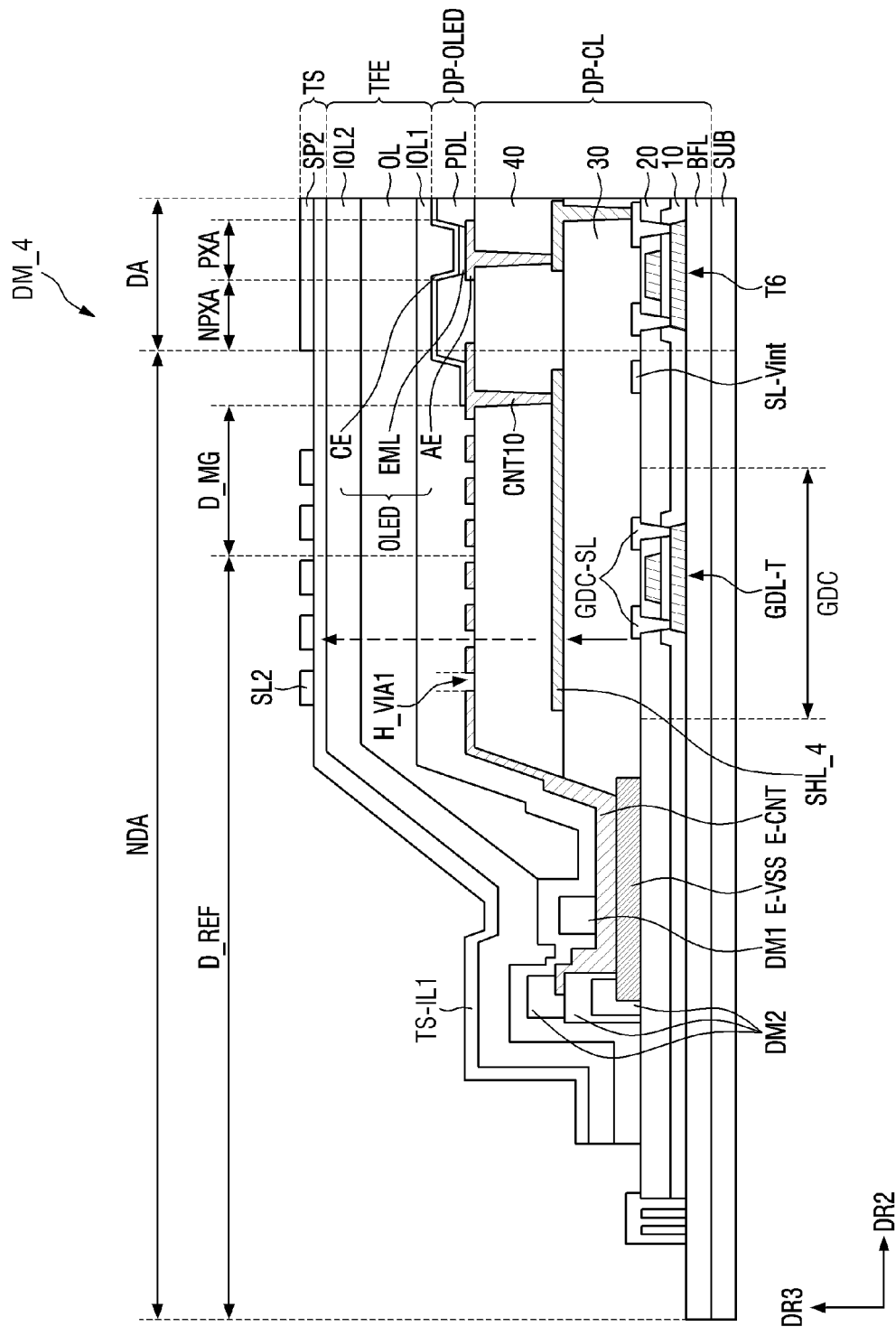
FIG. 21 is a cross-sectional view showing still another example of a display module in which the area AA shown in FIG. 3 is enlarged according to some exemplary embodiments.

FIG. 21 is a cross-sectional view showing still another example of a display module in which the area AA shown in FIG. 3 is enlarged according to some exemplary embodiments.

Referring to FIGS. 12 to 21, a display module DM_4 of FIG. 21 is different from the display module DM of FIG. 12 in that the display module DM_4 includes a shielding electrode SHL_4. The shielding electrode SHL_4 may be substantially the same as or similar to the shielding electrode SHL having been described with reference to FIG. 12, except for the position at which the shielding electrode SHL_4 is disposed and a connection relationship of the shielding electrode SHL_4. Therefore, a redundant description will not be repeated.

The shielding electrode SHL_4 may not overlap the power supply electrode E-VSS, and may be connected to the connection electrode E-CNT through a tenth through-hole CNT10 penetrating the fourth insulating layer 40 to expose the shielding electrode SHL_4. That is, the shielding electrode SHL_4 is electrically connected to the power supply electrode E-VSS, and may be electrically connected to the power supply electrode E-VSS through the connection electrode E-CNT.

In some exemplary embodiments, the tenth through-hole CNT10 may include (or be connected to) the second electrode CE, that is, may be formed adjacent to the display area DA, and may be formed through the same process as the ninth contact hole CNT9 having been described with reference to FIG. 6. In this case, similarly to FIG. 12, the shielding electrode SHL_4 covers the first through-holes H-VIA1 of the connection electrode E-CNT, thereby blocking the propagation of noise from the scan driving circuit GDC to the input sensing unit TS through the first through-holes H-VIA1.

Although it is shown in FIG. 21 that the shielding electrode SHL_4 is connected to the connection electrode E-CNT through one tenth contact hole CNT10, exemplary embodiments are not limited thereto. For example, the shielding electrode SHL_4 may be connected to the connection electrode E-CNT through a plurality of contact holes (not shown), which may be formed along the second direction DR2. Further, although it is shown in FIG. 21 that the shielding electrode SHL_4 does not include the second through-holes H_VIA2 (refer to FIG. 16), the shielding electrode SHL_4 may include the second through-holes H_VIA2.

According to various exemplary embodiments, a display device may include a shielding electrode disposed between a driving circuit and a connection electrode, and overlapping sensing signal lines of an input sensing unit, to thereby reduce noise that would otherwise propagate to and interfere with the input sensing unit. It is noted, however, that the effects of the inventive concepts are not limited by or to the foregoing, and other various effects are anticipated herein.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device, comprising:
a base layer comprising a display area and a non-display area;
a power supply electrode disposed on the base layer and disposed in the non-display area;
a driving circuit disposed on the base layer and disposed in the non-display area;
a first insulating layer disposed on the driving circuit;
a first electrode disposed on the first insulating layer, the first electrode overlapping the driving circuit in the non-display area;
a second insulating layer disposed on the first electrode;
a light emitting element disposed in the display area; and
a second electrode disposed on the second insulating layer, the second electrode overlapping the driving circuit in the non-display area,
wherein a first portion of the power supply electrode is disposed between the first insulating layer and the base layer,
the light emitting element comprises a third electrode disposed on the second insulating layer, a light emitting unit disposed on the third electrode, and a fourth electrode disposed on the light emitting unit; and
the second electrode is connected to the power supply electrode and the fourth electrode.

2. The display device of claim 1, wherein:
the first electrode comprises a plurality of through-holes exposing the first insulating layer; and
at least one of the through-holes overlaps the driving circuit in the non-display area.

3. The display device of claim 1, wherein:
the second electrode comprises a plurality of through-holes exposing the second insulating layer; and
at least one of the through-holes overlaps the first electrode in the non-display area.

4. The display device of claim 1, wherein:
the first electrode comprises a plurality of first through-holes exposing the first insulating layer;
the second electrode comprises a plurality of second through-holes exposing the second insulating layer; and
the first through-holes and the second through-holes do not overlap each other.

5. The display device of claim 1, wherein the second electrode and the third electrode are disposed directly on the second insulating layer.

6. The display device of claim 1, wherein:
the second electrode comprises a plurality of through-holes exposing the second insulating layer; and
at least one of the through-holes overlaps the fourth electrode.

7. The display device of claim 1, further comprising:
a transistor disposed in the display area, the transistor being disposed between the base layer and the first insulating layer; and
a conductive pattern disposed between the first insulating layer and the second insulating layer, the conductive pattern being connected to the transistor through a first contact hole penetrating the first insulating layer,
wherein the third electrode is connected to the conductive pattern through a second contact hole penetrating the second insulating layer.

8. The display device of claim 7, wherein the first electrode and the conductive pattern are disposed directly on the first insulating layer.

9. The display device of claim 7, wherein:
the transistor comprises an electrode directly contacting the conductive pattern; and
the electrode of the transistor and the power supply electrode are disposed directly on a same layer.

10. The display device of claim 1, further comprising:
an inorganic layer disposed on the fourth electrode; and
an input sensing layer disposed on the inorganic layer, the input sensing layer comprising sensing electrodes and sensing signal lines connected to the sensing electrodes,
wherein the sensing signal lines overlap the second electrode.

11. The display device of claim 10, wherein the sensing signal lines overlap the first electrode.

12. The display device of claim 10, wherein the inorganic layer overlaps the first electrode, the second electrode, and the power supply electrode.

13. The display device of claim 1, wherein the first electrode directly contacts the power supply electrode.

14. The display device of claim 13, wherein the first electrode directly contacts the second electrode.

15. The display device of claim 1, wherein a portion of the first electrode, a portion of the second electrode, and a second portion of the power supply electrode overlap each other.

16. The display device of claim 15, wherein the portion of the first electrode is disposed between the portion of the second electrode and the second portion of the power supply electrode.

17. A display device, comprising:
a base layer comprising a display area and a non-display area;
a power supply electrode disposed on the base layer and disposed in the non-display area;
a driving circuit disposed on the base layer and disposed in the non-display area;
a first insulating layer disposed on the driving circuit;
a first electrode disposed on the first insulating layer, the first electrode overlapping the driving circuit in the non-display area;
a second insulating layer disposed on the first electrode;
a light emitting element disposed in the display area; and
a second electrode disposed on the second insulating layer, the second electrode overlapping the driving circuit in the non-display area,
wherein:
a first portion of the power supply electrode is disposed between the first insulating layer and the base layer;
the light emitting element comprises a third electrode disposed on the second insulating layer, a light emitting unit disposed on the third electrode, and a fourth electrode disposed on the light emitting unit; and
the second electrode and the third electrode are disposed directly on the second insulating layer.

* * * * *